United States Patent
Sorimachi

(10) Patent No.: US 10,153,177 B2
(45) Date of Patent: Dec. 11, 2018

(54) WIRING SUBSTRATE AND SEMICONDUCTOR DEVICE

(71) Applicant: SHINKO ELECTRIC INDUSTRIES CO., LTD., Nagano-shi, Nagano-ken (JP)

(72) Inventor: Haruo Sorimachi, Nagano (JP)

(73) Assignee: SHINKO ELECTRIC INDUSTRIES CO., LTD. (JP)

( * ) Notice: Subject to any disclaimer, the term of this patent is extended or adjusted under 35 U.S.C. 154(b) by 0 days.

(21) Appl. No.: 15/633,078

(22) Filed: Jun. 26, 2017

(65) Prior Publication Data

US 2018/0005844 A1 Jan. 4, 2018

(30) Foreign Application Priority Data

Jun. 29, 2016 (JP) ................................. 2016-129022

(51) Int. Cl.
| | |
|---|---|
| *H01L 23/34* | (2006.01) |
| *H01L 21/48* | (2006.01) |
| *H01L 21/56* | (2006.01) |
| *H01L 23/31* | (2006.01) |
| *H01L 23/498* | (2006.01) |

(Continued)

(52) U.S. Cl.
CPC ........ *H01L 21/486* (2013.01); *H01L 21/4857* (2013.01); *H01L 21/563* (2013.01); *H01L 23/3128* (2013.01); *H01L 23/49811* (2013.01); *H01L 23/49838* (2013.01); *H01L 23/5383* (2013.01); *H01L 23/5384* (2013.01); *H01L 23/5385* (2013.01); *H01L 24/97* (2013.01);

(Continued)

(58) Field of Classification Search
CPC ......... H01L 23/49811; H01L 23/49838; H01L 23/5383–23/5385
USPC .................................................. 257/777, 723
See application file for complete search history.

(56) References Cited

U.S. PATENT DOCUMENTS 5,565,706 A * 10/1996 Miura .................... H01L 23/13
257/691
5,841,193 A * 11/1998 Eichelberger ....... H01L 23/5389
257/723

(Continued)

FOREIGN PATENT DOCUMENTS

| JP | 2006-261311 A | 9/2006 |
|---|---|---|
| JP | 2011-515842 A | 5/2011 |

(Continued)

*Primary Examiner* — Nitin Parekh
(74) *Attorney, Agent, or Firm* — Tarolli, Sundheim, Covell & Tummino LLP

(57) ABSTRACT

A wiring component electrically connects a first semiconductor element, including first and second electrode terminals, and a second semiconductor element, including third and fourth electrode terminals. The wiring component includes first and second connection terminals respectively connected to the first and third electrode terminals. A third connection terminal is connected to the second electrode terminal, and a fourth connection terminal is connected to the fourth electrode terminal. An insulation layer embeds the wiring component and the third and fourth connection terminals. A wiring layer is formed on a lower surface of the insulation layer and connected to an internal connection terminal and the third and fourth external terminals. Upper surfaces of the first to fourth external terminals are located coplanar with one another.

5 Claims, 15 Drawing Sheets

(51) Int. Cl.
*H01L 23/00* (2006.01)
*H05K 1/11* (2006.01)
*H01L 23/538* (2006.01)

(52) U.S. Cl.
CPC .... *H05K 1/113* (2013.01); *H01L 2224/45124* (2013.01); *H05K 2201/0979* (2013.01)

(56) References Cited

U.S. PATENT DOCUMENTS

| | | | | |
|---|---|---|---|---|
| 7,741,194 | B2* | 6/2010 | Griffiths | H01L 21/6835 257/E21.122 |
| 7,989,944 | B2* | 8/2011 | Tuominen | H01L 23/5389 257/678 |
| 8,212,355 | B2* | 7/2012 | Sunohara | H01L 21/6835 257/685 |
| 2003/0141105 | A1* | 7/2003 | Sugaya | H01L 21/56 174/256 |
| 2004/0195686 | A1* | 10/2004 | Jobetto | H01L 21/568 257/734 |
| 2007/0045815 | A1* | 3/2007 | Urashima | H05K 1/0231 257/698 |
| 2010/0258944 | A1* | 10/2010 | Uchiyama | H01L 23/5384 257/773 |
| 2016/0322295 | A1* | 11/2016 | Kobayashi | H01L 23/49838 |
| 2017/0069598 | A1* | 3/2017 | Nelson | H01L 23/5383 |
| 2017/0256482 | A1* | 9/2017 | Furuichi | H01L 21/486 |

FOREIGN PATENT DOCUMENTS

| | | |
|---|---|---|
| JP | 2013-243227 A | 12/2013 |
| JP | 2014-099591 A | 5/2014 |
| JP | 2014-179613 A | 9/2014 |

* cited by examiner

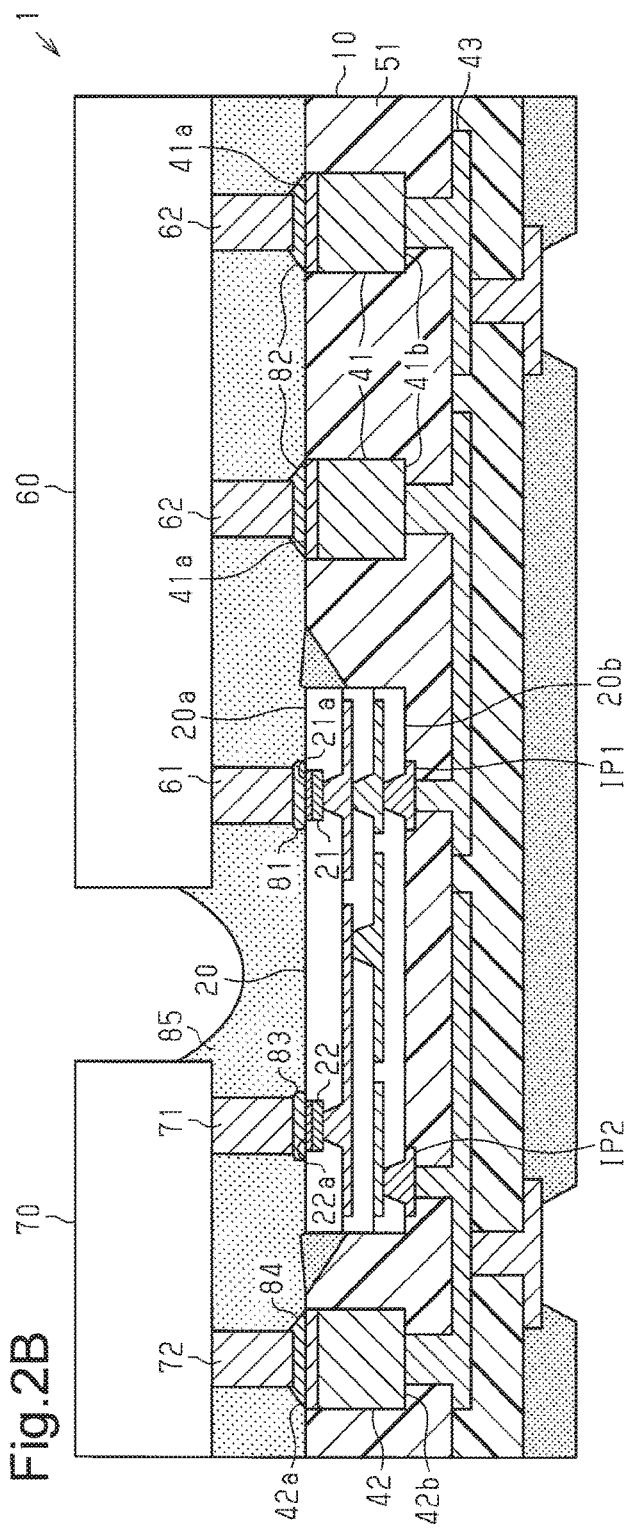
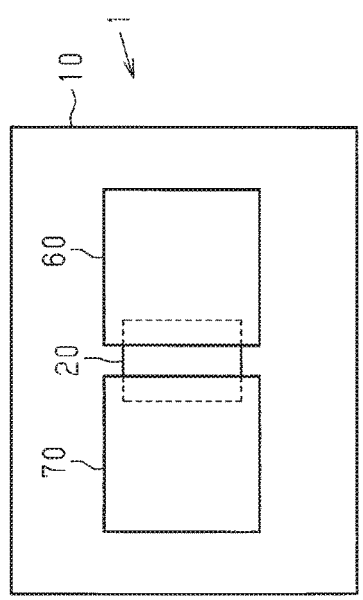
Fig.2B
Fig.2A

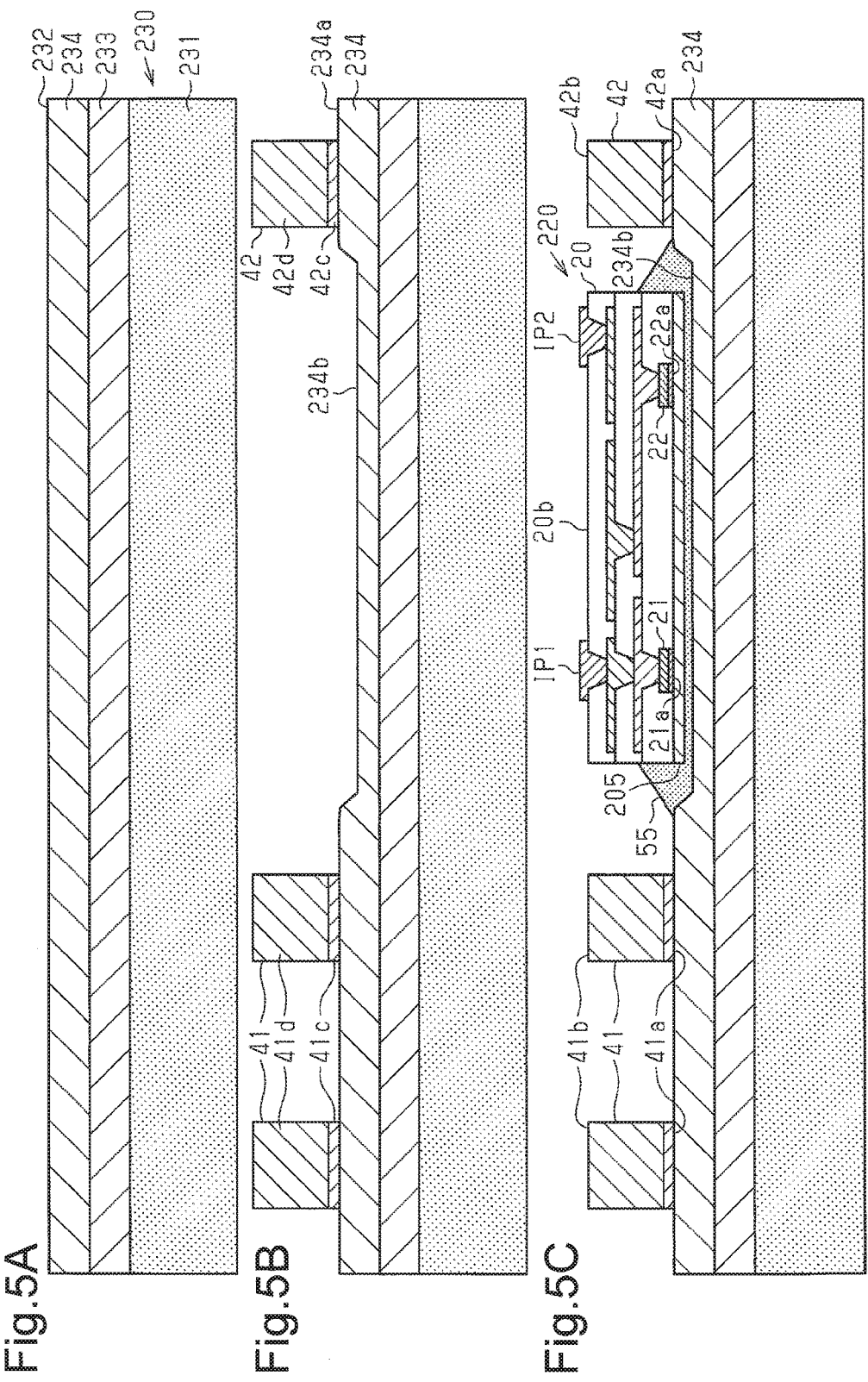

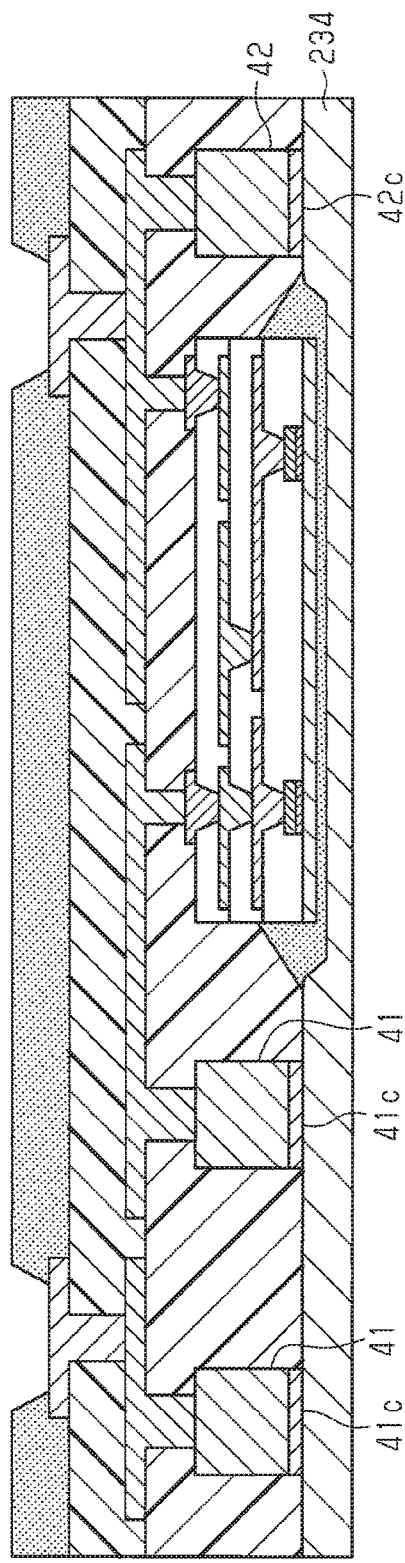

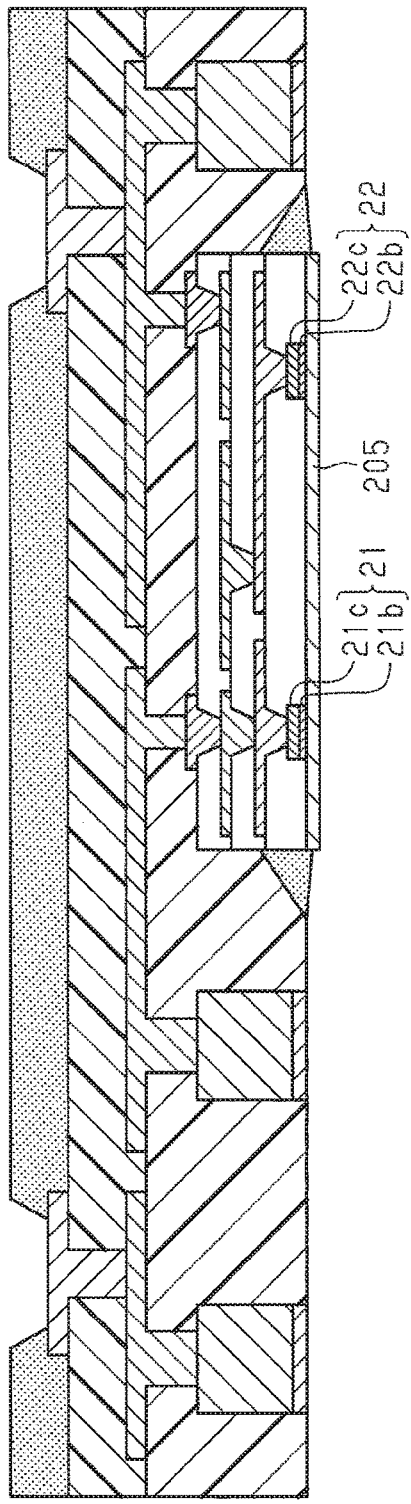
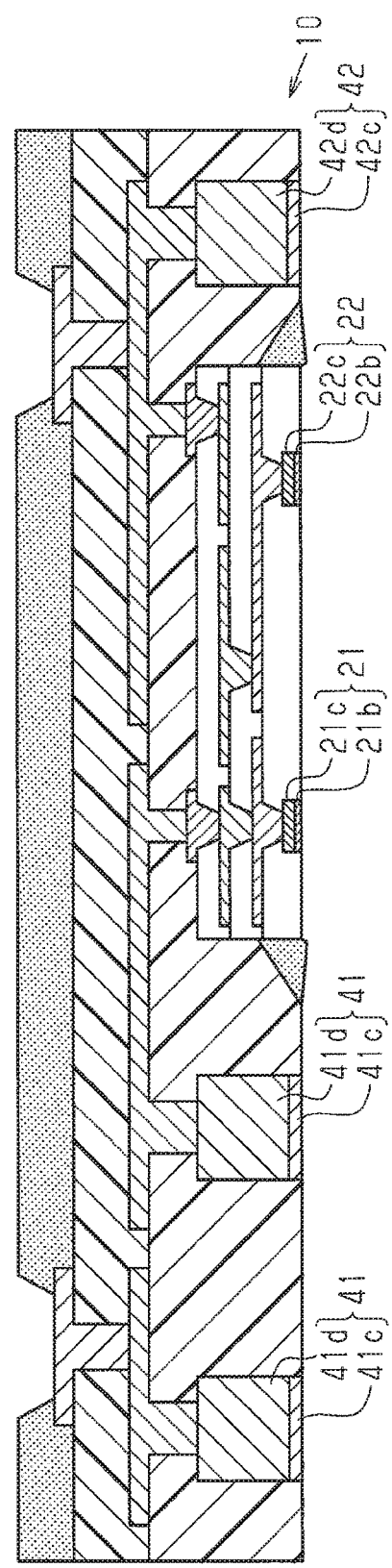
Fig.8A
Fig.8B

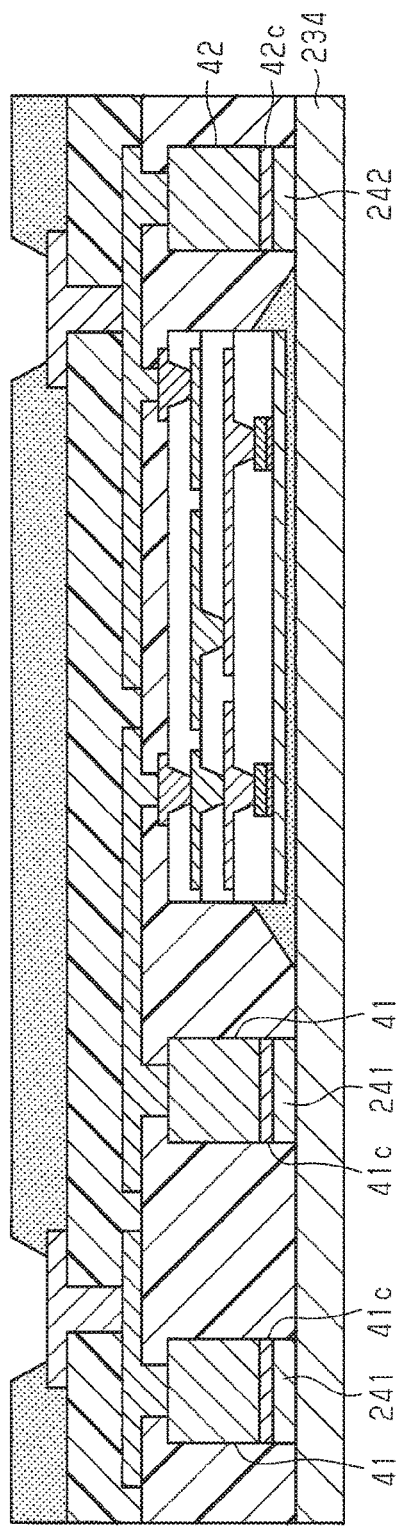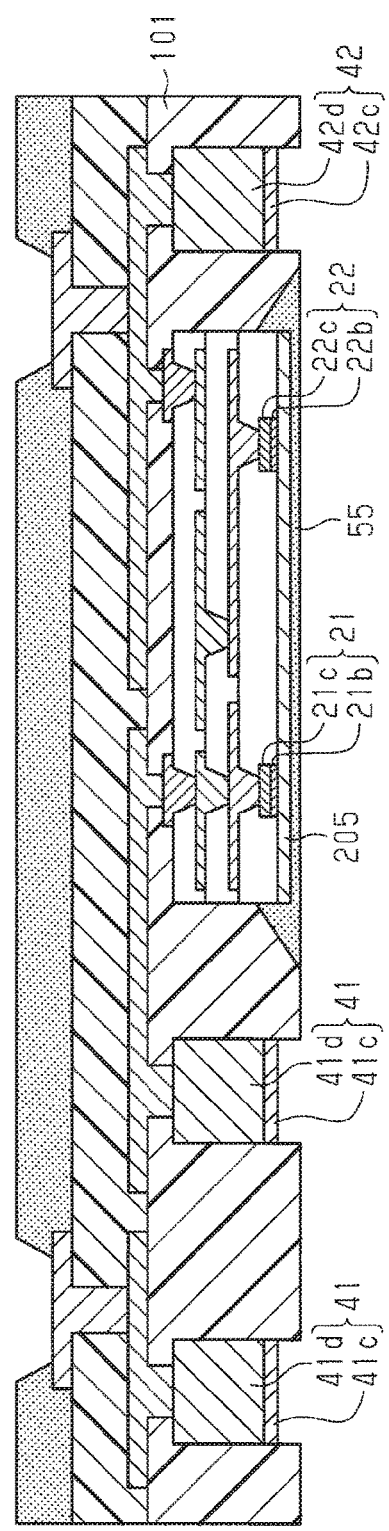

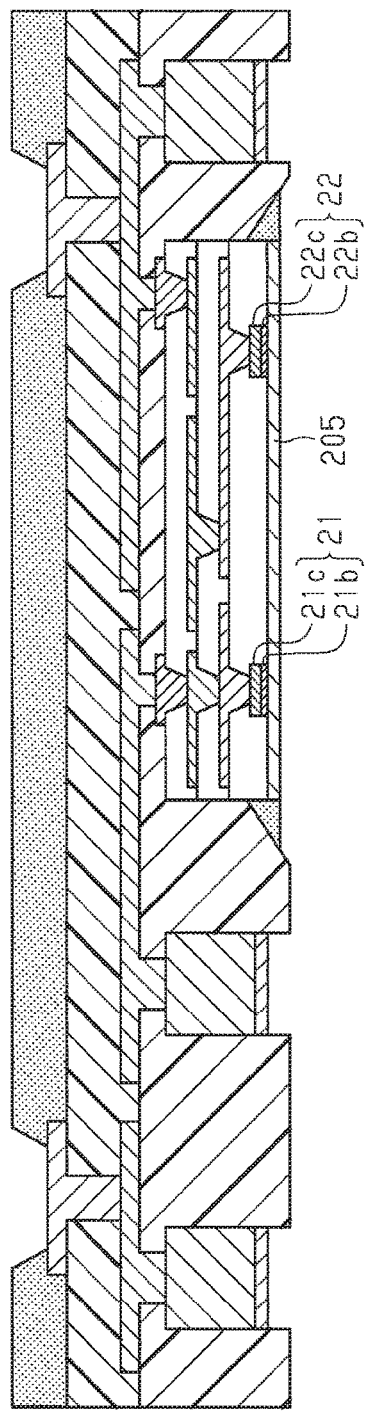
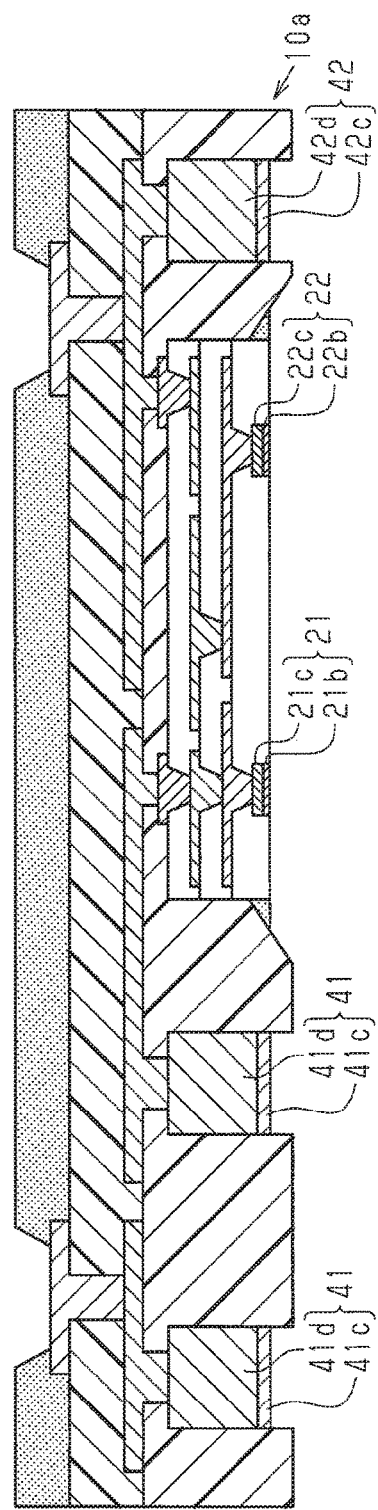
Fig.14A
Fig.14B

WIRING SUBSTRATE AND SEMICONDUCTOR DEVICE

CROSS-REFERENCE TO RELATED APPLICATIONS

This application is based upon and claims the benefit of priority from prior Japanese Patent Application No. 2016-129022, filed on Jun. 29, 2016, the entire contents of which are incorporated herein by reference.

FIELD

This disclosure relates to a wiring substrate, a semiconductor device, and a method for manufacturing a wiring substrate.

BACKGROUND

A semiconductor device used in an electronic device includes a wiring substrate and an electronic component, which is mounted on the wiring substrate. When the semiconductor device includes, for example, two electronic components arranged on the wiring substrate in a sideward direction, the two electronic components are connected to each other by wirings. There are various kinds of processes for connecting two electronic components including, for example, a process for arranging a wiring component that incorporates fine wirings on a wiring substrate and a process for forming fine wirings in a wiring substrate. Japanese Laid-Open Patent Publication Nos. 2006-261311, 2013-243227, 2014-99591, and 2014-179613 and Japanese National Phase Laid-Open Patent Publication No. 2011-515842 describe prior art examples of wiring substrates.

SUMMARY

A wiring substrate on which a plurality of electronic components is mounted needs to ensure the reliability for connecting the electronic components.

One embodiment is a wiring substrate that includes a wiring component adapted to connect a first semiconductor element and a second semiconductor element. The first semiconductor element includes a first electrode terminal and a second electrode terminal. The second semiconductor element includes a third electrode terminal and a fourth electrode terminal. The wiring component includes a first connection terminal, a second connection terminal, and an internal connection terminal. The first connection terminal is exposed on an upper surface of the wiring component and connected to the first electrode terminal of the first semiconductor element. The second connection terminal is exposed on the upper surface of the wiring component and connected to the third electrode terminal of the second semiconductor element. The internal connection terminal is formed on a lower surface of the wiring component. The wiring component electrically connects the first electrode terminal of the first semiconductor element and the third electrode terminal of the second semiconductor element. The wiring substrate further includes a third connection terminal, a fourth connection terminal, an insulation layer, and a wiring layer. The third connection terminal is connected to the second electrode terminal of the first semiconductor element. The fourth connection terminal is connected to the fourth electrode terminal of the second semiconductor element. The insulation layer embeds the wiring component, the third connection terminal, and the fourth connection terminal. The wiring layer is formed on a lower surface of the insulation layer and connected to the internal connection terminal. Upper surfaces of the first to fourth connection terminals are located coplanar with one another.

Another embodiment is a semiconductor device that includes a wiring substrate, a first semiconductor element that includes a first electrode terminal and a second electrode terminal, and a second semiconductor element that includes a third electrode terminal and a fourth electrode terminal. The wiring substrate includes a wiring component connected to the first semiconductor element and the second semiconductor element. The wiring component includes a first connection terminal, a second connection terminal, and an internal connection terminal. The first connection terminal is exposed on an upper surface of the wiring component and connected to the first electrode terminal of the first semiconductor element. The second connection terminal is exposed on the upper surface of the wiring component and connected to the third electrode terminal of the second semiconductor element. The internal connection terminal is formed on a lower surface of the wiring component. The wiring component electrically connects the first electrode terminal of the first semiconductor element and the third electrode terminal of the second semiconductor element. The wiring substrate further includes a third connection terminal, a fourth connection terminal, an insulation layer, and a wiring layer. The third connection terminal is connected to the second electrode terminal of the first semiconductor element. The fourth connection terminal is connected to the fourth electrode terminal of the second semiconductor element. The insulation layer embeds the wiring component, the third connection terminal, and the fourth connection terminal. The wiring layer is formed on a lower surface of the insulation layer and connected to the internal connection terminal. Upper surfaces of the first to fourth connection terminals are located coplanar with one another.

Another embodiment is a method for manufacturing a wiring substrate for mounting a first semiconductor element and a second semiconductor element thereon. The first semiconductor element includes a first electrode terminal and a second electrode terminal. The second semiconductor element includes a third electrode terminal and a fourth electrode terminal. The method includes forming a structural body that includes a wiring component and a metal foil that covers a first surface of the wiring component. The forming a structural body includes forming a first connection terminal and a second connection terminal that are exposed on the first surface of the wiring component. The first connection terminal is connectable to the first electrode terminal of the first semiconductor element. The second connection terminal is connectable to the third electrode terminal of the second semiconductor element. The first electrode terminal of the first semiconductor element is electrically connectable to the third electrode terminal of the second semiconductor element by the wiring component. The forming a structural body also includes forming an internal connection terminal on a second surface of the wiring component that is opposite to the first surface. The method further includes forming a mount recess in an upper surface of a first support substrate, forming an adhesive layer in the mount recess, and embedding the metal foil of the structural body in the mount recess to fix the structural body with the adhesive layer so that an upper surface of the metal foil is located at the same height as the upper surface of the first support substrate. The method further includes forming a third connection terminal and a fourth connection terminal on the upper surface of the first support substrate, and forming an insulation layer that covers the structural body, the third connection terminal, and the fourth connection terminal. The method further includes forming a wiring layer on an upper surface of the insulation layer, in which the wiring layer is connected to the internal connection terminal, the third connection terminal, and the fourth connection terminal. The method further includes removing the first support substrate, removing the adhesive layer to expose the metal foil of the structural body, and removing the metal foil of the structural body to expose the first connection terminal and the second connection terminal of the wiring component.

Another embodiment is a method for manufacturing a wiring substrate for mounting a first semiconductor element and a second semiconductor element thereon. The first semiconductor element includes a first electrode terminal and a second electrode terminal. The second semiconductor element includes a third electrode terminal and a fourth electrode terminal. The method includes forming a structural body that includes a wiring component and a metal foil that covers a first surface of the wiring component. The forming a structural body includes forming a first connection terminal and a second connection terminal that are exposed on the first surface of the wiring component. The first connection terminal is connectable to the first electrode terminal of the first semiconductor element. The second connection terminal is connectable to the third electrode terminal of the second semiconductor element. The first electrode terminal of the first semiconductor element is electrically connectable to the third electrode terminal of the second semiconductor element by the wiring component. The forming a structural body also includes forming an internal connection terminal on a second surface of the wiring component that is opposite to the first surface. The method further includes applying an adhesive layer to an upper surface of a first support substrate, adhering the metal foil of the structural body to the adhesive layer, and forming an auxiliary layer on the upper surface of the first support substrate so that an upper surface of the auxiliary layer and an upper surface of the metal foil are located at the same height. The method further includes forming a third connection terminal and a fourth connection terminal on the auxiliary layer, and forming an insulation layer that covers the structural body, the third connection terminal, and the fourth connection terminal. The method further includes forming a wiring layer on an upper surface of the insulation layer, in which the wiring layer is connected to the internal connection terminal, the third connection terminal, and the fourth connection terminal. The method further includes removing the first support substrate and the auxiliary layer, removing the adhesive layer to expose the metal foil of the structural body, and removing the metal foil of the structural body to expose the first connection terminal and the second connection terminal of the wiring component.

Other embodiments and advantages thereof will become apparent from the following description, taken in conjunction with the accompanying drawings, illustrating by way of example the principles of the invention.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which:

FIG. 2A is a schematic plan view illustrating a semiconductor device that includes the wiring substrate of FIG. 1A;

FIG. 2B is a schematic cross-sectional view illustrating the semiconductor device of FIG. 2A;

FIGS. 5A to 5C, 6, 7A, 7B, 8A, and 8B are schematic cross-sectional views illustrating a method for manufacturing the wiring substrate of FIG. 1A;

FIGS. 11A to 11C, 12, 13A, 13B, 14A, and 14B are schematic cross-sectional views illustrating a method for manufacturing the wiring substrate of the second embodiment.

DESCRIPTION OF THE EMBODIMENTS

Figure 1A:
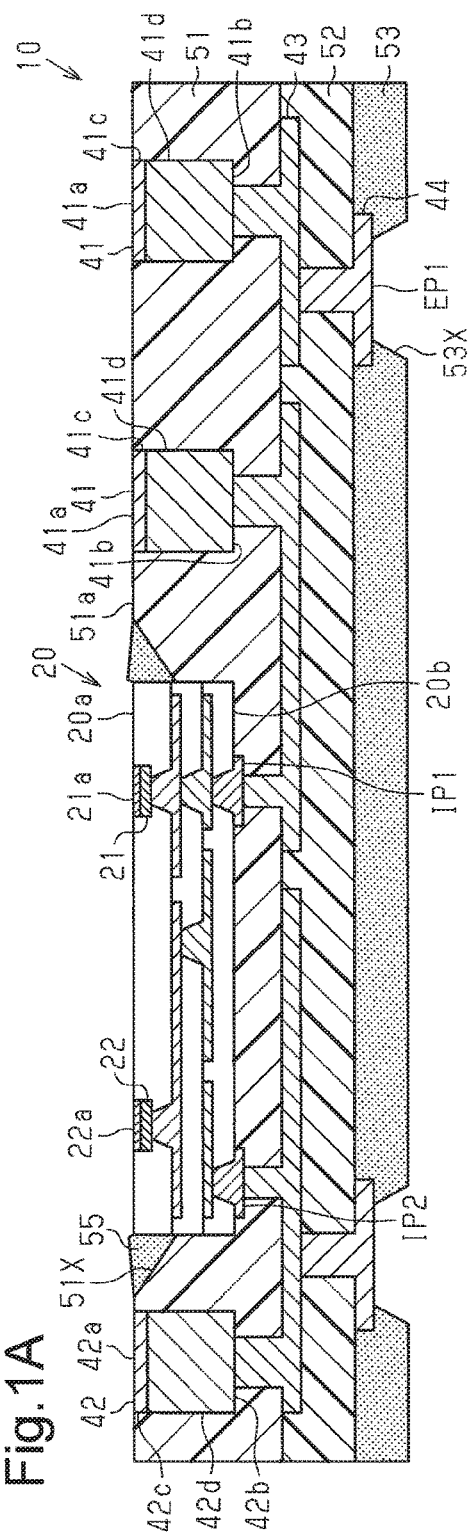
FIG. 1A is a schematic cross-sectional view illustrating a first embodiment of a wiring substrate.

Embodiments will now be described with reference to the accompanying drawings. Elements in the drawings may be partially enlarged for simplicity and clarity and thus have not necessarily been drawn to scale. To facilitate understanding, hatching lines may not be illustrated or be replaced by shadings in the cross-sectional drawings. In this specification, "in a plan view" refers to the view of a subject taken in a perpendicular direction (for example, vertical direction in FIG. 1A). Also, "the planar shape" refers to the shape of the subject as viewed in the perpendicular direction.

First Embodiment

A first embodiment will now be described with reference to FIGS. 1A to 8B.

As illustrated in FIG. 2A, a semiconductor device 1 includes a wiring substrate 10 and a plurality (two in FIG. 2A) of semiconductor elements 60, 70 mounted on the wiring substrate 10. The wiring substrate 10 includes a wiring component 20. The wiring component 20 overlaps a portion of each of the semiconductor elements 60, 70 in a plan view. The semiconductor element 60 includes an electrode terminal 61 connected to the wiring component 20. The semiconductor element 70 includes an electrode terminal 71 connected to the wiring component 20. The wiring component 20 electrically connects the electrode terminal 61 of the semiconductor element 60 and the electrode terminal 71 of the semiconductor element 70, which are connected to the wiring substrate 10.

The semiconductor element 60 (first semiconductor element) may be, for example, a logic chip such as a central processing unit (CPU) chip or a graphics processing unit (GPU) chip. The semiconductor element 70 (second semiconductor element) may be, for example, a memory chip such as a dynamic random access memory (DRAM) chip, a static random access memory (SRAM) chip, or a flash memory. The semiconductor elements 60, 70 may be a chip (die) formed by dividing a large scale semiconductor circuit into two or more (e.g., two).

As illustrated in FIG. 2B, the semiconductor element 60 includes the electrode terminal 61 and a plurality of electrode terminals 62. Each of the electrode terminals 61, 62 is, for example, pillar-shaped. The electrode terminal 61 is one example of a first electrode terminal. The electrode terminals 62 are each one example of a second electrode terminal. The semiconductor element 60 is connected to the wiring component 20 by the electrode terminal 61 and the wiring substrate 10 by the electrode terminals 62. In the same manner, the semiconductor element 70 includes the electrode terminal 71 and a plurality of electrode terminals 72 (only one illustrated in FIG. 2B). Each of the electrode terminals 71, 72 is, for example, pillar-shaped. The electrode terminal 71 is one example of a third electrode terminal. The electrode terminals 72 are each one example of a fourth electrode terminal. The semiconductor element 70 is connected to the wiring component 20 by the electrode terminal 71 and the wiring substrate 10 by the electrode terminals 72. The material of the electrode terminals 61, 62, 71, 72 may be, for example, copper or a copper alloy. FIG. 2B illustrates a portion of the semiconductor device 1 corresponding to where the semiconductor elements 60, 70 are connected to each other.

The gap between the wiring substrate 10 and the semiconductor elements 60, 70 is filled with an underfill resin 85. The underfill resin 85 increases the connection strength of portions that connect the wiring substrate 10 and the semiconductor elements 60, 70. The underfill resin 85 also limits the occurrence of corrosion and electromigration of wiring patterns thereby preventing decreases in the reliability of the wiring patterns. The material of the underfill resin 85 may be, for example, an insulative resin such as an epoxy resin in which a filler such as silica is mixed with the insulative resin.

The wiring substrate 10 will now be described. As illustrated in 1A, the wiring substrate 10 includes the wiring component 20, external terminals 41, 42, wiring layers 43, 44, insulation layers 51, 52, and a solder resist layer 53.

The wiring component 20 and the external terminals 41, 42 are embedded in the insulation layer 51. The insulation layer 51 exposes an upper surface 20a of the wiring component 20 and upper surfaces 41a, 42a of the external terminals 41, 42. In other words, the insulation layer 51 covers lower and side surfaces of the wiring component 20 and lower and side surfaces of the external terminals 41, 42.

Figure 1B:
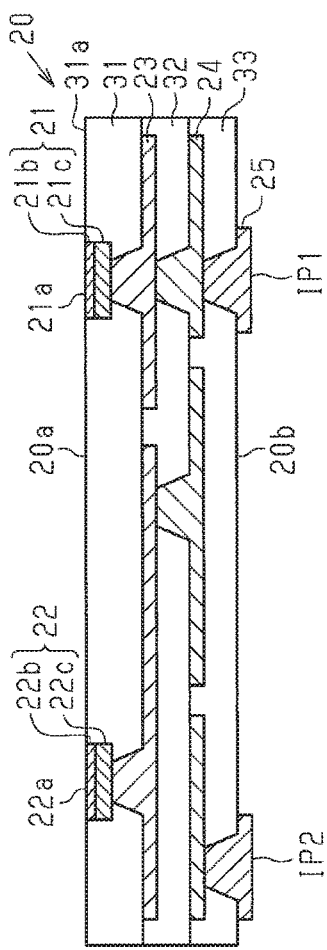
FIG. 1B is a schematic cross-sectional view illustrating a wiring component arranged on the wiring substrate of FIG. 1A.

As illustrated in FIG. 1B, the wiring component 20 includes external terminals 21, 22 (pads), wiring layers 23, 24, 25, and insulation layers 31, 32, 33. The wiring component 20 is formed, for example, through a build-up process.

The external terminals 21, 22 are embedded in the insulation layer 31, which is the outermost one (here, uppermost layer) of the insulation layers 31, 32, 33 of the wiring component 20. The external terminals 21, 22 respectively include upper surfaces 21a, 22a, which are located coplanar with an upper surface 31a of the insulation layer 31. Thus, the insulation layer 31 covers lower and side surfaces of each of the external terminals 21, 22.

The external terminals 21, 22 each have the form of, for example, a circular plate in a plan view. The dimensions of the external terminals 21, 22 may be set so that each of the external terminals 21, 22 has a diameter of, for example, 15 to 30 micrometers (μm). The external terminal 21 is one example of a first connection terminal and includes a plurality (two in present example) of metal layers 21b, 21c. The external terminal 22 is one example of a second connection terminal and includes a plurality (two in present example) of metal layers 22b, 22c. Each of the metal layers 21b, 22b is exposed on the upper surface 31a of the insulation layer 31 and is, for example, a gold (Au) layer. Each of the metal layers 21c, 22c is embedded in the insulation layer 31 and is, for example, a nickel (Ni) layer. The thickness of each Au layer may be set to, for example, 0.1 to 0.2 μm. The thickness of each Ni layer may be set to, for example, 2 to 6 μm. The thickness of the insulation layer 31 may be set to, for example, 5 to 10 μm.

The wiring layer 23 is formed on a lower surface of the insulation layer 31. The wiring layer 23 includes via wirings, which extend through the insulation layer 31 in the thickness-wise direction to be connected to the external terminals 21, 22, and wiring patterns, which are electrically connected to the external terminals 21, 22 by the via wirings and formed on the lower surface of the insulation layer 31. The thickness of each wiring pattern may be set to, for example, 2 to 5 μm. The width of the wiring pattern may be set to, for example, 2 to 5 μm. Pitches of the wiring patterns may be set to, for example, 2 to 5 μm.

The insulation layer 32 is formed on the lower surface of the insulation layer 31 to cover the wiring layer 23. The wiring layer 24 is formed on a lower surface of the insulation layer 32. The wiring layer 24 includes via wirings, which extend through the insulation layer 32 in the thickness-wise direction, and wiring patterns, which are electrically connected to the wiring layer 23 by the via wiring and formed on the lower surface of the insulation layer 32. The dimensions (thickness, wiring width, wiring interval of wiring patterns) of the wiring layer 24 may be set in the same manner as those of the wiring layer 23 described above.

The insulation layer 33 is formed on the lower surface of the insulation layer 32 to cover the wiring layer 24. The wiring layer 25 is formed on a lower surface of the insulation layer 33. The wiring layer 25 includes via wirings, which extend through the insulation layer 33 in the thickness-wise direction, and wiring patterns, which are electrically connected to the wiring layer 24 by the via wirings and formed on the lower surface of the insulation layer 33. The wiring patterns of the wiring layer 25, which are formed on the lower surface of the insulation layer 33, function as internal connection terminals IP1, IP2. Each of the internal connection terminals IP1, IP2 is, for example, circular and has a dimension (diameter) of, for example, 40 μm.

The material of the wiring layers 23, 24, 25 may be, for example, copper or a copper alloy. The material of the insulation layers 31, 32, 33 may be, for example, a photosensitive resin (e.g., polyimide resin, silicone resin, phenol resin).

As illustrated in FIG. 1A, the insulation layer 51 includes an upper surface 51a including an opening 51X located in a portion that surrounds side surfaces of the wiring component 20. The opening 51X is tapered so as to become smaller at positions further from the upper surface 51a of the insulation layer 51. An adhesive 55 is located in the opening 51X. The adhesive 55 illustrated in FIG. 1A is a remaining portion of an adhesive (adhesive 55 illustrated in FIG. 5C) that is used to adhere the wiring component 20 (structural body 220) to a metal foil 234 in a manufacturing process described below. The material of the adhesive 55 may be, for example, an insulative resin such as an epoxy resin or a polyimide resin.

As illustrated in FIG. 1A, the external terminals 41, 42 are each, for example, rod-shaped. The upper surfaces 41a, 42a of the external terminals 41, 42 are located coplanar with the upper surfaces 21a, 22a of the external terminals 21, 22 of the wiring component 20. Additionally, lower surfaces 41b, 42b of the external terminals 41, 42 are located substantially coplanar with a lower surface 20b of the wiring component 20.

The dimensions of the external terminals 41, 42 may be set so that each of the external terminals 41, 42 has a diameter of, for example, 40 μm. The height (length in thickness-wise direction) of each of the external terminals 41, 42 is changed in accordance with the thickness of the wiring component 20 and may be set to, for example, 15 to 21 μm.

Each of the external terminals 41 is one example of a third connection terminal and includes a surface-processed layer 41c, which is exposed from the insulation layer 51, and a metal post 41d, which is located below the surface-processed layer 41c and embedded in the insulation layer 51. The external terminal 42 is one example of a fourth connection terminal and includes a surface-processed layer 42c, which is exposed from the insulation layer 51, and a metal post 42d, which is located below the surface-processed layer 42c and embedded in the insulation layer 51.

The material of the metal posts 41d, 42d may be, for example, copper or a copper alloy. Each of the surface-processed layers 41c, 42c may be, for example, an Ni/Au layer (metal layer in which Ni layer serves as bottom layer and Ay layer is formed on Ni layer). The thickness of the Au layer is, for example, 0.1 to 0.2 μm. The thickness of the Ni layer is, for example, 2 to 5 μm. Examples of the surface-processed layers 41c, 42c include an Au layer and an Ni/palladium (Pd)/Au layer (metal layer in which Ni layer serves as bottom layer and Ni layer, Pd layer, and Au layer are sequentially stacked). Additionally, an anti-oxidizing process such as an organic solderability preservative (OSP) process may be performed to form a surface-processed layer. For example, when the OSP process is performed, the surface-processed layer is formed by an organic coating of an azole compound or an imidazole compound.

The wiring layer 43 is formed on a lower surface of the insulation layer 51. The wiring layer 43 includes via wirings, which extend through the insulation layer 51 in the thickness-wise direction to be connected to the external terminals 41, 42 and the internal connection terminals IP1, IP2 of the wiring component 20, and wiring patterns, which are electrically connected to the external terminals 41, 42 and the internal connection terminals IP1, IP2 by the via wirings and formed on the lower surface of the insulation layer 51. The insulation layer 52 is formed on the lower surface of the insulation layer 51 to cover the wiring layer 43. The wiring layer 44 includes via wirings, which extend through the insulation layer 52 in the thickness-wise direction and to be connected to the wiring layer 43, and wiring patterns, which are electrically connected to the wiring layer 43 by the via wirings and formed on a lower surface of the insulation layer 52.

The wiring width and wiring interval of the wiring patterns in the wiring layers 43, 44 are set to have larger values than the wiring width and wiring interval of the wiring patterns in the wiring layers 23, 24 of the wiring component 20. In other words, the wiring layers 23, 24 of the wiring component 20 are finer than the wiring layers 43, 44.

The solder resist layer 53 is formed on the lower surface of the insulation layer 52 to partially cover the wiring layer 44. The solder resist layer 53 includes openings 53X, which partially expose a lower surface of the wiring layer 44 as external connection terminals EP1. Bumps (not illustrated) are formed on the external connection terminals EP1 to mount the wiring substrate 10 (semiconductor device 1 illustrated in FIG. 2A) on a board or the like. The bumps may be, for example, solder bumps.

The material of the wiring layers 43, 44 may be, for example, copper or a copper alloy. The material of the insulation layers 51, 52 may be, for example, an insulative resin such as an epoxy resin or a polyimide resin or a resin material in which a filler such as silica or alumina is mixed with an insulative resin such as that described above. Alternatively, the material of the insulation layers 51, 52 may be, for example, an insulative resin that contains a reinforcement material and is obtained by impregnating a reinforcement material such as a woven or non-woven cloth of glass fibers, aramid fibers, or liquid crystal polymer (LCP) fibers with a thermosetting resin, the main component of which is an epoxy resin or a polyimide resin. Alternatively, the material of the insulation layers 51, 52 may be a thermosetting insulative resin or a photosensitive insulative resin.

The solder resist layer 53 may be, for example, a photosensitive dry film resist or a liquid photoresist. Such a resist material may be, for example, a novolac resin or an acrylic resin. For example, when a photosensitive dry film resist is used, the insulation layer 52 and the wiring layer 44 are laminated with a dry film through thermocompression. The dry film is patterned through photolithography. This forms the solder resist layer 53 that includes the openings 53X. When a liquid photoresist is used, the solder resist layer 53 is formed through the same steps.

A method for manufacturing the wiring substrate 10 will now be described. For the sake of brevity, portions that ultimately become components of the wiring substrate 10 may be indicated by reference characters used to denote the final components.

A method for manufacturing the wiring component 20 will first be described.

Figure 3A:
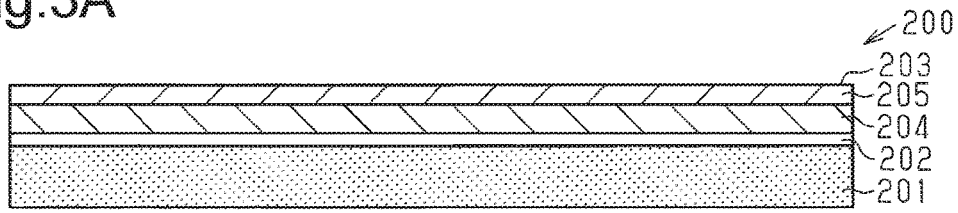
FIGS. 3A to 3E and 4A to 4D are schematic cross-sectional views illustrating a method for manufacturing a wiring component.

In the step of FIG. 3A, a support substrate 200 is formed. The support substrate 200 includes a support body 201 and a carrier-incorporating metal foil 203 (peelable metal foil), which is adhered to an upper surface of the support body 201 by an adhesive layer 202. The support substrate 200 is one example of a second support substrate. The thickness of the support body 201 may be, for example, 0.5 to 1 millimeters (mm). Glass or stainless steel may be use as the support body 201. The adhesive layer 202 is a thermal resistant adhesive of, for example, epoxy. The thickness of the adhesive layer 202 may be set to, for example, 10 to 20 μm.

The carrier-incorporating metal foil 203 includes a carrier plate 204 and a very thin metal foil 205, which is formed on an upper surface of the carrier plate 204 with a delamination layer (not illustrated) located in between. The carrier plate 204 is, for example, a 35-μm copper foil. The metal foil 205 is, for example, a 5-μm copper foil.

Figure 3B:
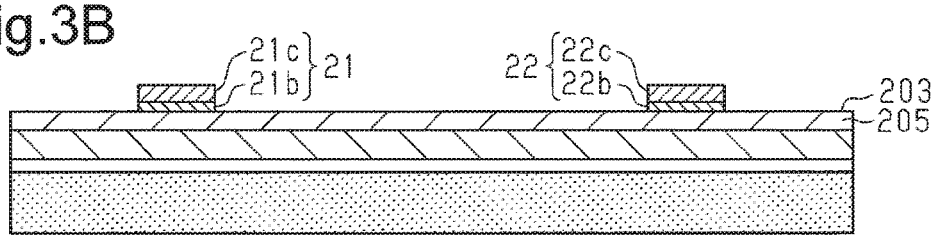

In the step of FIG. 3B, the external terminals 21, 22 are formed on the upper surface of the carrier-incorporating metal foil 203 (metal foil 205). In the present example, a resist layer including openings in given locations is formed on the upper surface of the metal foil 205. The openings expose portions of the carrier-incorporating metal foil 203 (metal foil 205) corresponding to where the external terminals 21, 22 will be formed. The resist layer may be, for example, a photosensitive dry film resist or a liquid photoresist. Such a resist material may be, for example, a novolac resin or an acrylic resin. For example, when a photosensitive dry film resist is used, the upper surface of the metal foil 205 is laminated with a dry film through thermocompression. The dry film is patterned by performing exposure and development. This forms the resist layer that includes the openings. When a liquid photoresist is used, the resist layer may be formed through the same steps. Then, electrolytic plating (electrolytic gold plating) is performed using the resist layer as a plating mask and the metal foil 205 as a plating feeding layer to form the metal layers 21b, 22b on the upper surface of the metal foil 205. Additionally, electrolytic plating (electrolytic nickel plating) is performed to form the metal layers 21c, 22c. Subsequently, the resist layer is removed, for example, by an alkaline stripping solution.

Figure 3C:
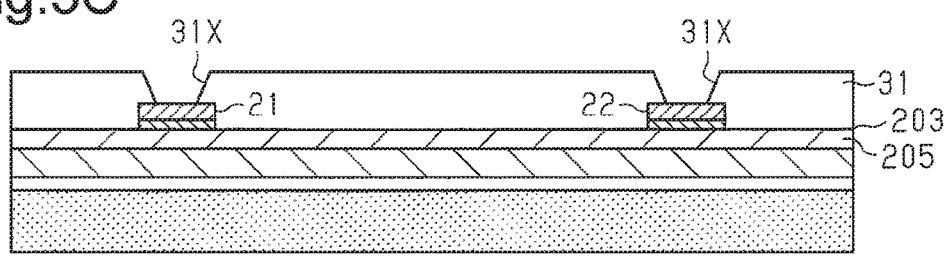

In the step of FIG. 3C, an insulation material is applied to the upper surface of the carrier-incorporating metal foil 203 (metal foil 205) to cover the external terminals 21, 22, and the insulation material undergoes exposure, development, and curing. This forms the insulation layer 31 that includes via holes 31X. The insulation material may be, for example, a photosensitive resin (e.g., polyimide resin, silicone resin, phenol resin). The via holes 31X expose the upper surfaces of the external terminals 21, 22 having a diameter of, for example, 5 to 15 μm. The via holes 31X each have the form of a truncated cone so that, for example, the diameter of the upper end, which is located at the upper surface of the insulation layer 31, is greater than the diameter of the bottom (at upper surfaces of external terminals 21, 22).

Figure 3D:
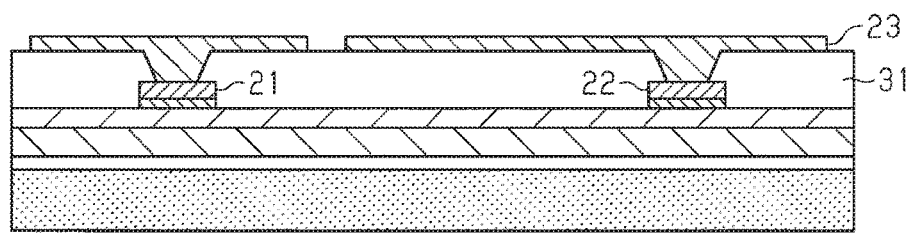

In the step of FIG. 3D, the wiring layer 23 is formed on the insulation layer 31, for example, through a semi-additive process. In the present example, a seed layer is formed on the upper surface of the insulation layer 31. The seed layer may be, for example, a lamination film of a titanium (Ti) film having a thickness of 0.1 μm and a Cu film having a thickness of 0.2 μm. The seed layer may be formed, for example, through sputtering. Then, a resist layer that includes openings in given locations is formed on the seed layer. The resist layer may be, for example, a photosensitive dry film or a liquid photoresist that is resistant to plating. Such a resist material may be, for example, a novolac resin or an acrylic resin. Electrolytic plating (electrolytic copper plating) is performed using the resist layer as a plating mask and the seed layer as a plating power feeding layer to form an electrolytic plating layer. After the resist layer is removed, for example, by an alkaline stripping solution, unnecessary portions of the seed layer are removed using the electrolytic plating layer as an etching mask. This forms the wiring layer 23. The above steps allow the via wirings of the wiring layer 23 to have the form of a truncated cone so that the diameter of the upper end, which is located at the upper surface of the insulation layer 31, is greater than the diameter of the bottom (at upper surfaces of external terminals 21, 22).

Figure 3E:
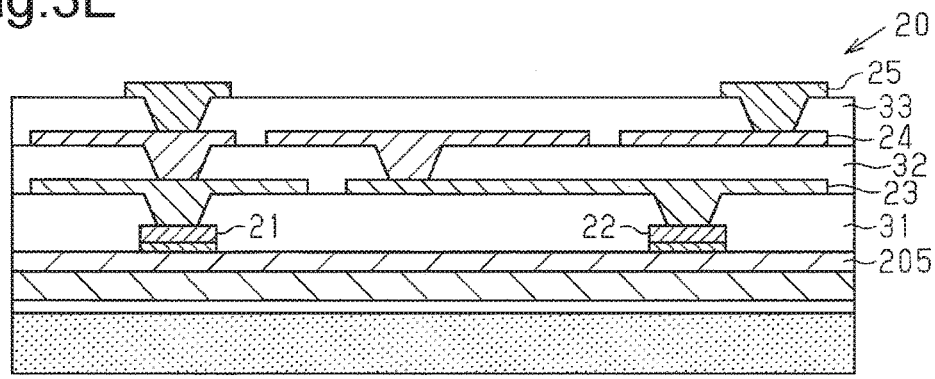

In the step of FIG. 3E, the insulation layer 32, the wiring layer 24, the insulation layer 33, and the wiring layer 25 are sequentially formed by repeating the same steps as those performed for forming the insulation layer 31 and the wiring layer 23 described above. This forms the wiring component 20 on the metal foil 205.

Figure 4A:
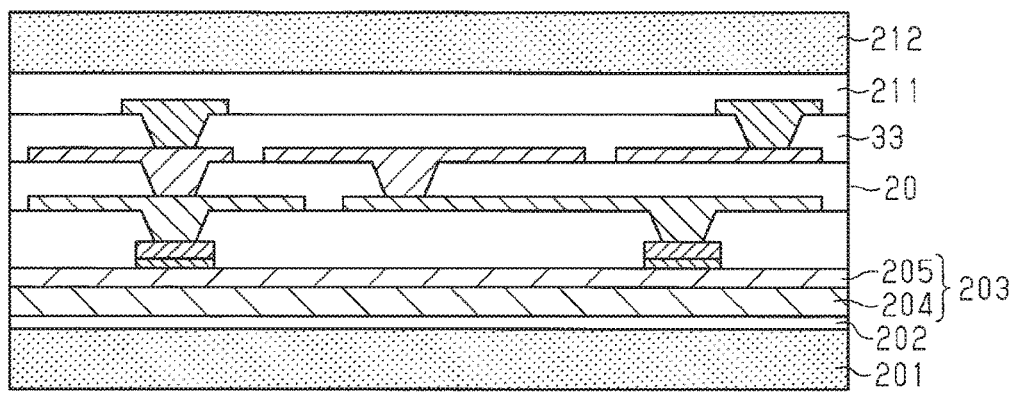

In the step of FIG. 4A, an adhesive 211 is applied to an upper surface of the insulation layer 33 to cover the insulation layer 33 and the wiring layer 25. A carrier film 212 adheres to the adhesive 211. The carrier film 212 is one example of a first support layer. The adhesive 211 may be, for example, a material, the adhesive of which is decreased when irradiated with ultraviolet rays. The carrier film 212 may be, for example, a dicing tape.

Figure 4B:
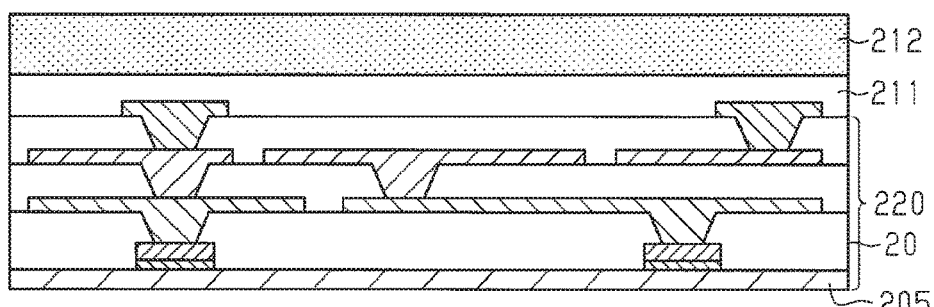

In the step of FIG. 4B, the carrier plate 204 of the carrier-incorporating metal foil 203, illustrated in FIG. 4A, is delaminated together with the delamination layer from the metal foil 205 to remove the support body 201, the adhesive layer 202, and the carrier plate 204. This forms a structural body 220 that includes the wiring component 20 and the metal foil 205. The metal foil 205 covers the wiring component 20 and the surface (upper surface 31a in FIG. 1B) of the insulation layer 31 in which the external terminals 21, 22 are formed.

Figure 4C:
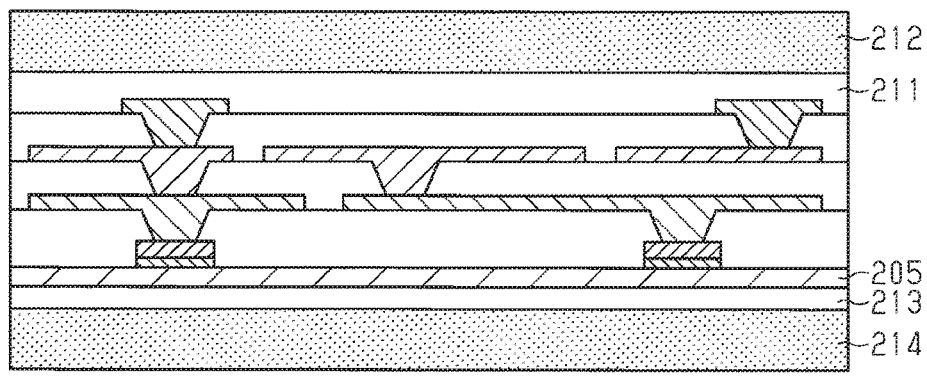

In the step of FIG. 4C, a carrier film 214 is adhered to a lower surface of the metal foil 205 by an adhesive 213. The carrier film 214 is one example of a second support layer. The adhesive 213 may be, for example, a material, the adhesiveness of which is decreased when irradiated with ultraviolet rays. The carrier film 214 may be, for example, a dicing tape.

Figure 4D:
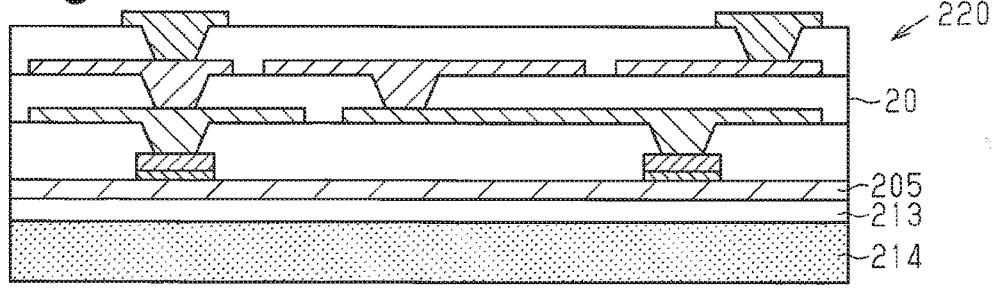

In the step of FIG. 4D, the adhesive 211 illustrated in FIG. 4C is irradiated with ultraviolet rays. This decreases the adhesiveness of the adhesive 211 and removes the carrier film 212 and the adhesive 211. Consequently, the structural body 220 is supported by the carrier film 214, which adheres to the side at which the metal foil 205 is located. In the steps of FIGS. 4A to 4D, the delamination of the support body 201 and the supporting of the structural body 220 are performed at the side of the metal foil 205. Thus, when the structural body 220 is supported by a mounting device from the upper side in FIG. 4D, the structural body 220 may be mounted on a mount subject with the metal foil 205 located downward. For example, when a batch of the structural bodies 220 is simultaneously is formed, the structural bodies 220 may be singulated by performing dicing as necessary.

In the step of FIG. 5A, a support substrate 230 is prepared. The support substrate 230 includes a support body 231 and a carrier-incorporating metal foil 232, which is formed on an upper surface of the support body 231. The support substrate 230 is one example of a first support substrate. The support body 231 may be, for example, a core material obtained by impregnating a reinforcement material such as a woven or non-woven cloth of glass fibers, aramid fibers, or liquid crystal polymer (LCP) fibers with a thermosetting resin such as an epoxy resin or a polyimide resin. The carrier-incorporating metal foil 232 includes a carrier layer 233 and a metal foil 234, which is formed on an upper surface of the carrier layer 233 with a delamination layer (not illustrated) located in between. The carrier layer 233 is adhered to the upper surface of the support body 231 by an adhesive layer (not illustrated). The carrier layer 233 is, for example, a copper plate having a thickness of approximately 35 μm. The metal foil 234 is, for example, a copper foil having a thickness of approximately 20 to 35 μm.

In the step of FIG. 5B, a mount recess 234b, in which the structural body 220 (refer to FIG. 4D) is mounted, is formed in the metal foil 234. The external terminals 41, 42 are formed on an upper surface of the metal foil 234. The depth of the mount recess 234b is set so that the surfaces 21a, 22a of the external terminals 21, 22 of the structural body 220, illustrated in FIG. 4D, are located coplanar with an upper surface 234a of the metal foil 234. The depth of the mount recess 234b is set so that, for example, the metal foil 205 of the structural body 220 and an adhesive that adheres the structural body 220 to the metal foil 234 are embedded in the mount recess 234b. The depth of the mount recess 234b may be set to, for example, 15 μm.

The mount recess 234b may be formed, for example, through etching (half-etching). Then, a resist layer is formed on the upper surface 234a of the metal foil 234. The resist layer may be, for example, a photosensitive dry film resist or a liquid photoresist that is resistant to etching. Such a resist material may be, for example, a novolac resin or an acrylic resin. For example, when a photosensitive dry film resist is used, the upper surface 234a of the metal foil 234 is laminated with a dry film through thermocompression. The dry film is patterned by performing exposure and development to form the above resist layer. Half-etching is performed on the metal foil 234 using the resist layer as an etching mask to form the mount recess 234b. Subsequently, the resist layer is removed, for example, by an alkaline stripping solution.

The external terminals 41, 42 may be formed, for example, through electrolytic plating. In the present example, a resist layer that includes openings where the external terminals 41, 42 will be formed is formed on the upper surface of the metal foil 234. The resist layer may be, for example, a plating resistant photosensitive dry film resist (e.g., novolac resin or acrylic resin). In this case, the upper surface of the metal foil 234 is laminated with a dry film, and the dry film is patterned through photolithography. This forms the above resist layer including the openings. Alternatively, a liquid photoresist (e.g., novolac resin or acrylic resin) may be used to form the resist layer.

Then, electrolytic plating is performed using the resist layer as a plating mask and the metal foil 234 as a plating power feeding layer. This sequentially forms the surface-processed layers 41c, 42c and the metal posts 41d, 42d on the upper surface 234a of the metal foil 234 that is exposed in each opening of the resist layer. For example, when the surface-processed layers 41c, 42c are each an Au/Ni layer, an Au layer having a thickness of 0.1 to 0.2 μm and an Ni layer having a thickness of 2 to 5 μm are sequentially formed on the upper surface 234a of the metal foil 234 to form the surface-processed layers 41c, 42c. Then, a Cu layer is formed on each of the surface-processed layers 41c, 42c to form the metal posts 41d, 42d. Subsequently, the resist layer is removed, for example, an alkaline stripping solution.

In the step of FIG. 5C, the adhesive 55 (e.g., adhesive film) and the structural body 220 are arranged in the mount recess 234b. The material of the adhesive 55 may be, for example, an insulative resin such as an epoxy resin or a polyimide resin. The adhesive 55 is cured to fix the structural body 220 to the metal foil 234. The formation of the mount recess 234b, in which the structural body 220 is located, allows the surfaces 21a, 22a of the external terminals 21, 22 of the wiring component 20 to be coplanar with the surfaces 41a, 42a of the external terminals 41, 42. The surfaces 41b, 42b of the external terminals 41, 42 are located substantially coplanar with the lower surface 20b of the wiring component 20 of the structural body 220.

Figure 6:
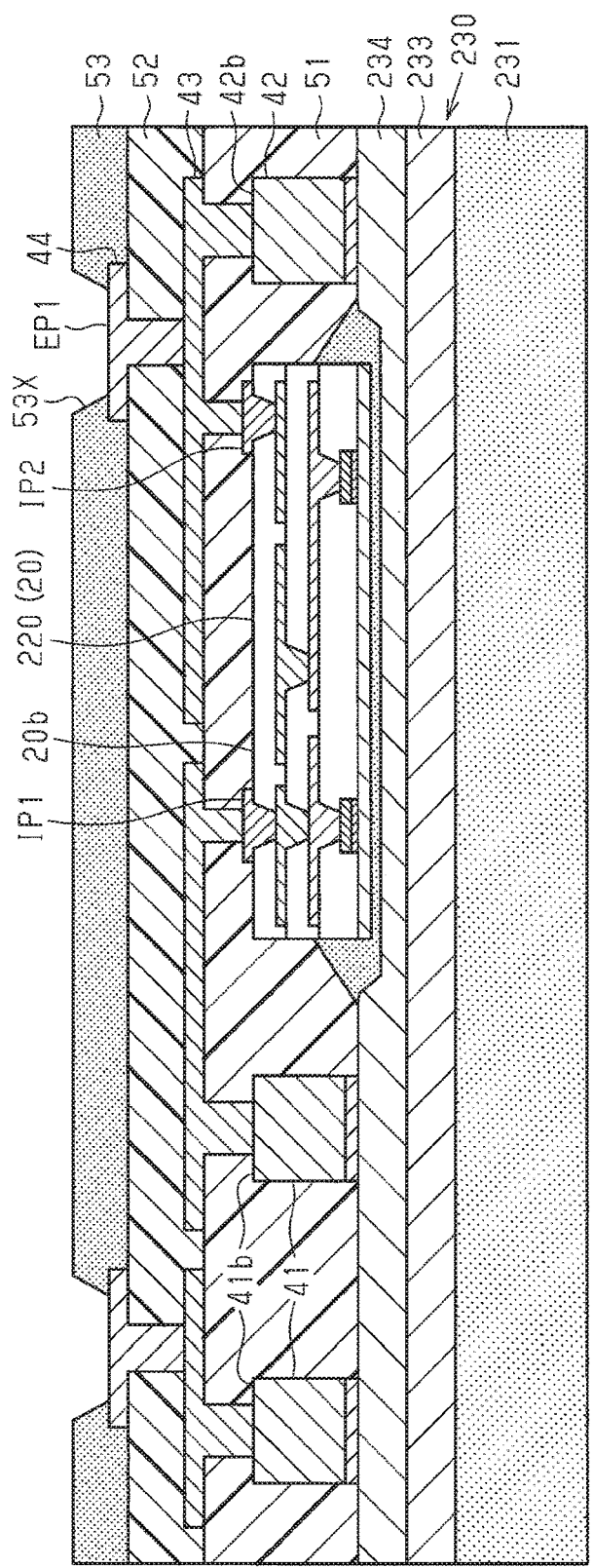

In the step of FIG. 6, the insulation layer 51, the wiring layer 43, the insulation layer 52, the wiring layer 44, and the solder resist layer 53 are formed. The insulation layer 51 is first formed to cover the external terminals 41, 42 and the structural body 220 (wiring component 20). Then, via holes extending through the insulation layer 51 are formed to partially expose the surfaces 41b, 42b of the external terminals 41, 42 and upper surfaces of the internal connection terminals IP1, IP2. The via holes are formed through laser drilling using, for example, a $CO_2$ laser or a YAG laser. When laser drilling is performed to form the via holes, a desmear process is performed as necessary. The surfaces 41b, 42b of the external terminals 41, 42 are located substantially coplanar with the lower surface 20b (upper surface in FIG. 6) of the wiring component 20 of the structural body 220. Thus, when the via holes are formed through laser drilling, the surfaces 41b, 42b of the external terminals 41, 42 and the upper surfaces of the internal connection terminals IP1, IP2 are exposed in substantially the same process time.

The wiring layer 43 is formed on the upper surface of the insulation layer 51, for example, through a semi-additive process. In the present example, a seed layer is first formed on the upper surface of the insulation layer 51 and wall surfaces of the via holes through electroless plating or sputtering. The seed layer is formed from, for example, copper. Then, a resist layer that includes openings in given locations is formed. Electrolytic plating (electrolytic copper plating) is performed using the seed layer as a plating power feeding layer to form a metal plating layer (copper plating layer) in the openings of the resist layer. After the resist layer is removed, unnecessary portions of the seed layer are removed through etching. This forms the wiring layer 43.

The insulation layer 52 is formed in the same manner as the insulation layer 51 described above. Additionally, the wiring layer 44 is formed in the same manner as the wiring layer 43 described above.

The solder resist layer 53 including the openings 53X is formed on the upper surface of the insulation layer 52. The solder resist layer 53 is obtained, for example, by laminating with a photosensitive solder resist film or applying a liquid solder resist and then performing photolithography on the resist so that the resist undergoes exposure and development to be patterned in the desired shape. The openings 53X of the solder resist layer 53 expose portions of the wiring layer 44 as the external connection terminals EP1.

In the step of FIG. 7A, the carrier layer 233, illustrated in FIG. 6, is delaminated from the metal foil 234 to remove the support body 231 and the carrier layer 233 from the metal foil 234.

In the step of FIG. 7B, the metal foil 234, illustrated in FIG. 7A, is removed, for example, through etching. In the etching performed on the metal foil 234, the surface-processed layers 41c, 42c of the external terminals 41, 42 function as etching stoppers.

In the step of FIG. 8A, the adhesive 55, which covers the lower surface of the metal foil 205, is removed to expose the lower surface of the metal foil 205. For example, sandblasting, laser abrasion, or mechanical polishing may be used as the process for removing the adhesive 55. In this step, the portions other than the adhesive 55 are covered by a resist layer and protected from the removal process. The resist layer is removed after this process.

In the step of FIG. 8B, the metal foil 205, illustrated in FIG. 8A, is removed, for example, through etching. This exposes surfaces (lower surface in FIG. 8B) of the metal layers 21b, 22b (Au layers) of the external terminals 21, 22. Additionally, surfaces (lower surfaces in FIG. 8B) of the surface-processed layers 41c, 42c (Au/Ni layers) of the external terminals 41, 42 are exposed. The metal layers 21b, 22b and the surface-processed layers 41c, 42c, which function as the etching stoppers, allow the metal foil 205 to be selectively etched and removed. The removal of the metal foil 205 obtains the wiring substrate 10.

The operation of the wiring substrate 10 will now be described.

As illustrated in FIG. 2A, the semiconductor device 1 includes the wiring substrate 10 and the semiconductor elements 60, 70, which are mounted on the upper surface of the wiring substrate 10. The wiring substrate 10 includes the wiring component 20 that connects the semiconductor elements 60, 70.

As illustrated in FIG. 2B, the semiconductor element 60 includes the electrode terminals 61, 62. The dimensions of the electrode terminals 61, 62 may be set to have, for example, a diameter of 20 to 30 μm and a height that is approximately 1.5 times greater the diameter. The material of the electrode terminals 61, 62 may be, for example, copper or a copper alloy.

In the semiconductor element 60, the electrode terminal 61 is connected to the external terminal 21 of the wiring component 20 by a solder member 81. The electrode terminals 62 are connected to the external terminals 41 of the wiring substrate 10 by solder members 82. The material of the solder members 81, 82 may be, for example, an alloy of tin (Sn) and silver (Ag), an alloy of Sn and Au, an alloy of Sn and Cu, or an alloy of Sn, Ag, and Cu. For example, when Sn—Ag-based solder is used, reflow soldering may be performed at a temperature of approximately 245° C.

The upper surface 21a of the external terminal 21 of the wiring component 20 is located coplanar with the upper surfaces 41a of the external terminals 41 embedded in the insulation layer 51. This is advantageous for connecting the electrode terminal 61 of the semiconductor element 60 to the external terminal 21 of the wiring component 20 and connecting the electrode terminals 62 of the semiconductor element 60 to the external terminals 41 of the wiring substrate 10. In the present example, the electrode terminals 61, 62 having the same length (height) allow for connection of the semiconductor element 60 to the wiring substrate 10 at a high throughput yield. This ensures the connection reliability. Additionally, even when the lengths of the electrode terminals 61, 62 slightly differ from one another, the solder members 81, 82 located on distal ends of the electrode terminals 61, 62 absorb the differences.

In the same manner, the semiconductor element 70 includes the electrode terminals 71, 72. The dimensions of the electrode terminals 71, 72 may be set, for example, to have a diameter of 20 to 30 μm and a height that is approximately 1.5 times greater than the diameter. The material of the electrode terminals 71, 72 may be, for example, copper or a copper alloy.

In the semiconductor element 70, the electrode terminal 71 is connected to the external terminal 22 of the wiring component 20 by a solder member 83. The electrode terminals 72 are connected to the external terminals 42 of the wiring substrate 10 by solder members 84. The material of the solder members 83, 84 may be, for example, an alloy of tin (Sn) and silver (Ag), an alloy of Sn and Au, an alloy of Sn and Cu, or an alloy of Sn, Ag, and Cu. For example, when Sn—Ag-based solder is used, reflow soldering may be performed at a temperature of approximately 245° C.

The upper surface 22a of the external terminal 22 of the wiring component 20 is located coplanar with the upper surface 42a of the external terminal 42 embedded in the insulation layer 51. This is advantageous for connecting the electrode terminal 71 of the semiconductor element 70 to the external terminal 22 of the wiring component 20 and connecting the electrode terminals 72 of the semiconductor element 70 to the external terminals 42 of the wiring substrate 10. In the present example, the electrode terminals 71, 72 having the same length (height) allow for connection of the semiconductor element 70 to the wiring substrate 10 at a high throughput yield. This ensures the connection reliability. Additionally, even when the lengths of the electrode terminals 71, 72 slightly differ from one another, the solder members 83, 84 located on distal ends of the electrode terminals 71, 72 absorb the differences.

The semiconductor elements 60, 70 are connected to each other by the wiring component 20. The wiring component 20 includes the wiring layers 23, 24, which are finer than the wiring layers 43, 44. Thus, the use of the wiring component 20 reduces manufacturing costs as compared to when fine wirings are formed in the entire wiring substrate 10 on which the semiconductor elements 60, 70 are mounted.

As illustrated in FIG. 1A, the internal connection terminals IP1, IP2 are arranged in the lower surface 20b of the wiring component 20. The internal connection terminals IP1, IP2 are connected to the wiring layer 43. Thus, desired signals or power may be provided to the wiring component 20 through the wiring layer 43 and the internal connection terminals IP1, IP2.

When manufacturing the wiring substrate 10, the wiring layers 43, 44 are sequentially formed on the support substrate 230 (metal foil 234) on which the wiring component 20 is mounted. Such a manufacturing method reduces the number of manufacturing steps thereby reducing the manufacturing costs as compared to when a cavity that accommodates the wiring component 20 is formed in an insulation layer of the wiring substrate.

The first embodiment has the advantages described below.

(1-1) The semiconductor elements 60, 70 are mounted on the wiring substrate 10. The wiring substrate 10 includes the wiring component 20. The wiring component 20 electrically connects the electrode terminal 61 of the semiconductor element 60 to the electrode terminal 71 of the semiconductor element 70. The wiring component 20 includes the external terminal 21, which is connected to the electrode terminal 61 of the semiconductor element 60, and the external terminal 22, which is connected to the electrode terminal 71 of the semiconductor element 70. The external terminals 21, 22 are exposed on the upper surface 20a of the wiring component 20. The wiring component 20 includes the internal connection terminals IP1, IP2 located in the lower surface 20b, which is opposite to the upper surface 20a. The wiring substrate 10 includes the external terminals 41, which are connected to the electrode terminals 62 of the semiconductor element 60, and the external terminals 42, which are connected to the electrode terminals 72 of the semiconductor element 70. The wiring component 20 and the external terminals 41, 42 are embedded in the insulation layer 51 of the wiring substrate 10. The wiring layer 43 is formed on the lower surface of the insulation layer 51 and connected to the external terminals 41, 42 and the internal connection terminals IP1, IP2 of the wiring component 20.

The upper surfaces 21a, 22a of the external terminals 21, 22 of the wiring component 20 are located coplanar with the upper surfaces 41a, 42a of the external terminals 41, 42. This is advantageous for connecting the electrode terminal 61 of the semiconductor element 60 to the external terminal 21 of the wiring component 20 and connecting the electrode terminals 62 of the semiconductor element 60 to the external terminals 41 of the wiring substrate 10. In the present example, the electrode terminals 61, 62 having the same length allow for connection of the semiconductor element 60 to the wiring substrate 10 at a higher throughput yield. This ensures the connection reliability. Additionally, even when the lengths of the electrode terminals 61, 62 slightly differ from one another, the solder members 81, 82 located on distal ends of the electrode terminals 61, 62 absorb the differences. This also ensures the connection reliability. With the semiconductor element 70, the connection reliability is ensured in the same manner.

(1-2) The semiconductor element 60 and the semiconductor element 70 are connected to each other by the wiring component 20. The wiring component 20 includes the fine wiring layers 23, 24. This reduces the manufacturing costs as compared to when fine wirings are formed throughout the wiring substrate 10 on which the semiconductor elements 60, 70 are mounted.

(1-3) The internal connection terminals IP1, IP2 are formed in the lower surface 20b of the wiring component 20. The internal connection terminals IP1, IP2 are connected to the wiring layer 43. Thus, desired signals or power may be provided to the wiring component 20 through the wiring layer 43 and the internal connection terminals IP1, IP2.

(1-4) The wiring layers 43, 44 are sequentially formed on the support substrate 230 (metal foil 234) on which the wiring component 20 is formed. Such a manufacturing method reduces the number of manufacturing steps thereby reducing the manufacturing costs as compared to when the wiring substrate includes an insulation layer having a cavity that accommodates the wiring component 20.

Second Embodiment

A second embodiment will now be described with reference to FIGS. 9A to 14B. The same reference characters are given to components of the second embodiment that are the same as the corresponding components of the first embodiment. Such components may not be described in detail.

Figure 10:
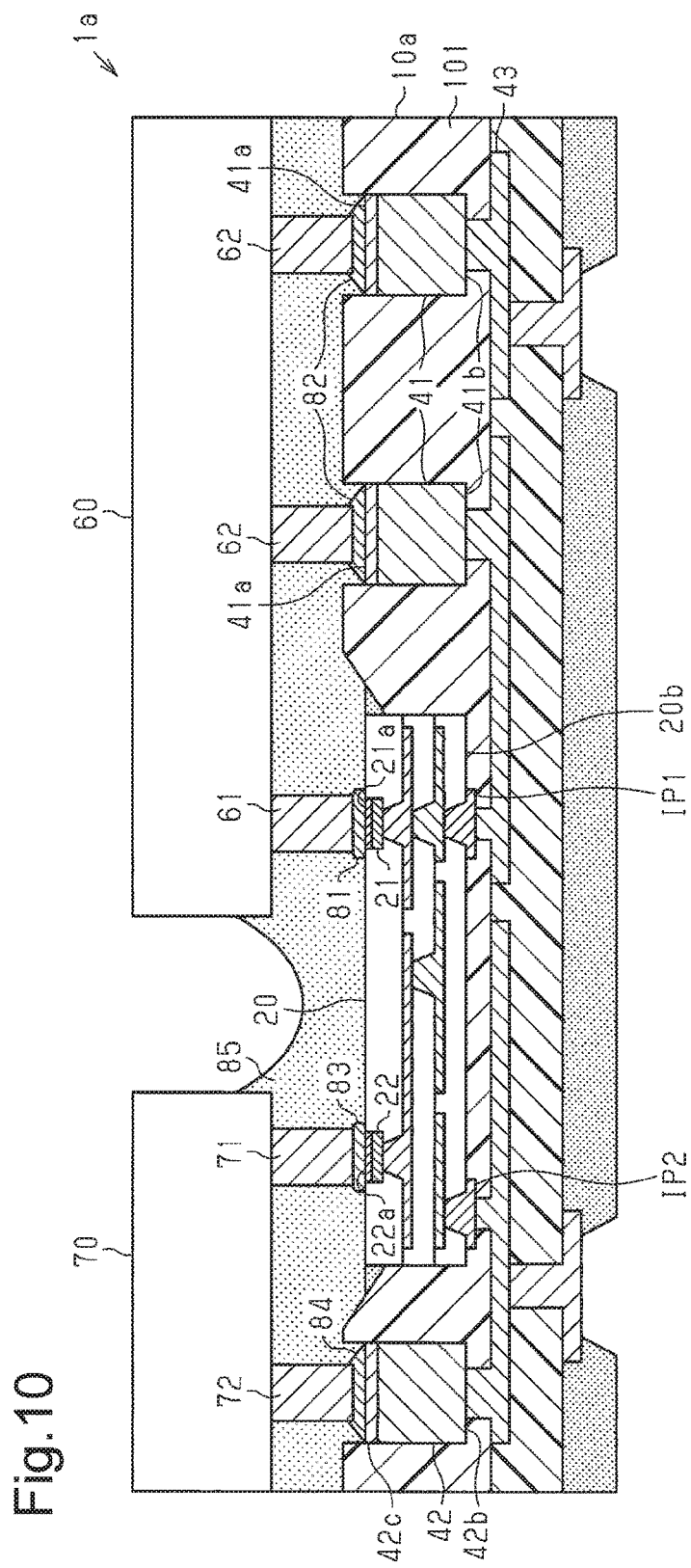
FIG. 10 is a schematic cross-sectional view illustrating a semiconductor device that includes the wiring substrate of FIG. 9A.
Figure 11:
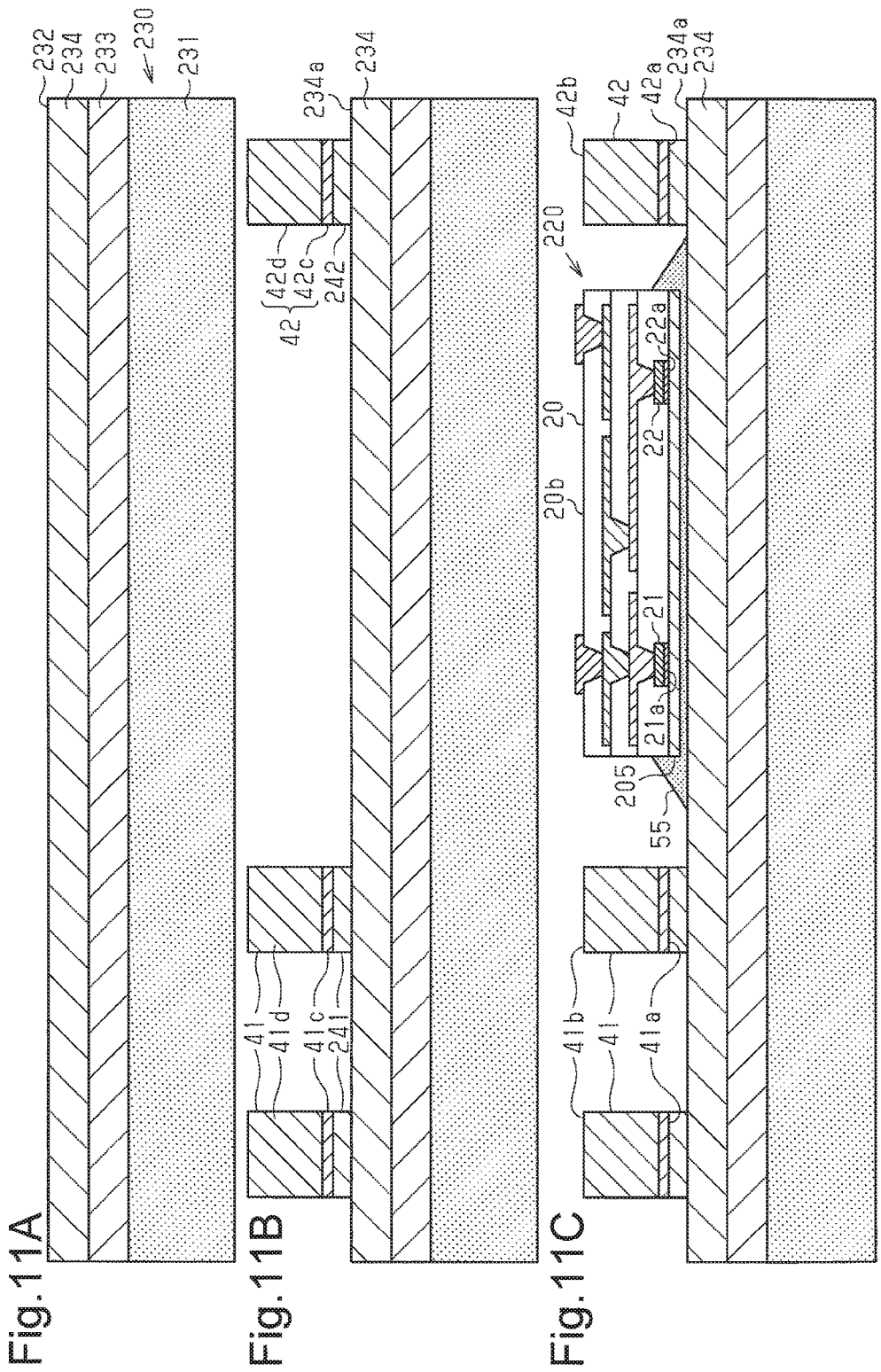

As illustrated in FIG. 10, a semiconductor device 1a includes a wiring substrate 10a, a plurality (two in FIG. 10) of semiconductor elements 60, 70, which are mounted on the wiring substrate 10a, and the underfill resin 85. FIG. 10 illustrates a portion of the semiconductor device 1a corresponding to where the semiconductor elements 60, 70 are connected to each other.

In the same manner as the first embodiment, the semiconductor element 60 includes the electrode terminals 61, 62 (pillars). The semiconductor element 70 includes the electrode terminals 71, 72 (pillars). The wiring substrate 10a includes the wiring component 20 that electrically connects the semiconductor elements 60, 70 to each other. The semiconductor element 60 is connected to the wiring component 20 by the electrode terminal 61 and the wiring substrate 10a by the electrode terminals 62. In the same manner, the semiconductor element 70 is connected to the wiring component 20 by the electrode terminal 71 and the wiring substrate 10a by the electrode terminals 72. The material of the electrode terminals 61, 62, 71, 72 may be, for example, copper or a copper alloy.

The gap between the wiring substrate 10a and the semiconductor elements 60, 70 is filled with the underfill resin 85. The material of the underfill resin 85 may be, for example, an insulative resin such as an epoxy resin in which a filler such as silica is mixed with the insulative resin.

Figure 9A:
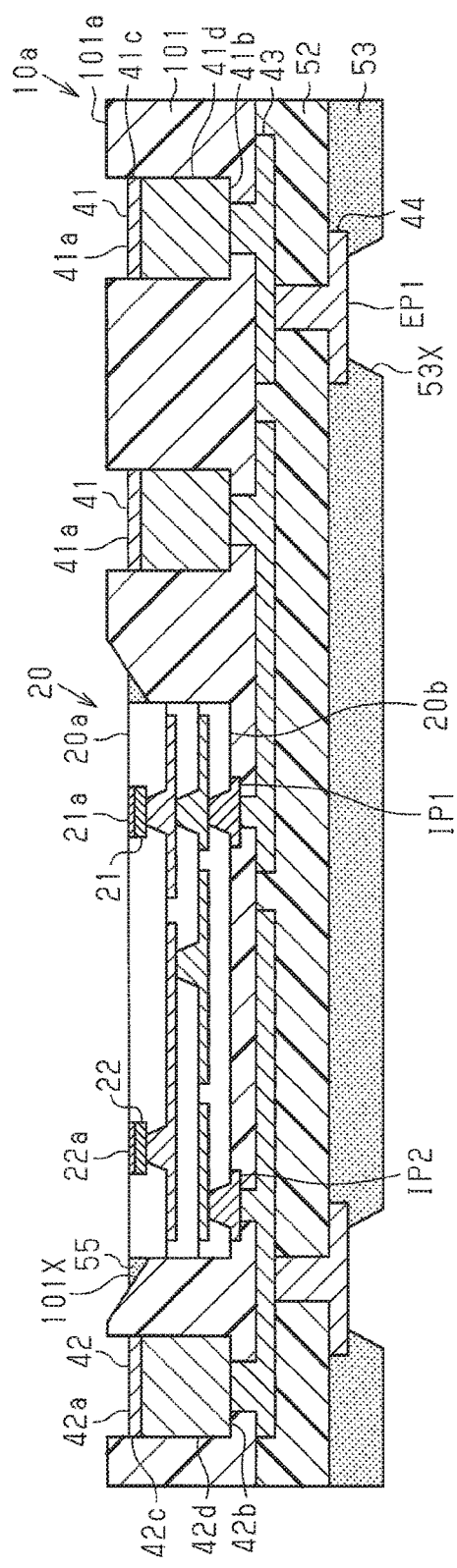
FIG. 9A is a schematic cross-sectional view illustrating a second embodiment of a wiring substrate.

As illustrated in FIG. 9A, the wiring substrate 10a includes the wiring component 20, the external terminals 41, 42, the wiring layers 43, 44, an insulation layer 101, the insulation layer 52, and the solder resist layer 53.

The wiring component 20 and the external terminals 41, 42 are embedded in the insulation layer 101. The insulation layer 101 exposes the upper surface 20a of the wiring component 20 and the upper surfaces 41a, 42a of the external terminals 41, 42. In other words, the insulation layer 101 covers the lower and side surfaces of the wiring component 20 and the lower and side surfaces of the external terminals 41, 42.

In the second embodiment, the upper surface 20a of the wiring component 20 and the upper surfaces 41a, 42a of the external terminals 41, 42 are located at lower positions than an upper surface 101a of the insulation layer 101.

Figure 9B:
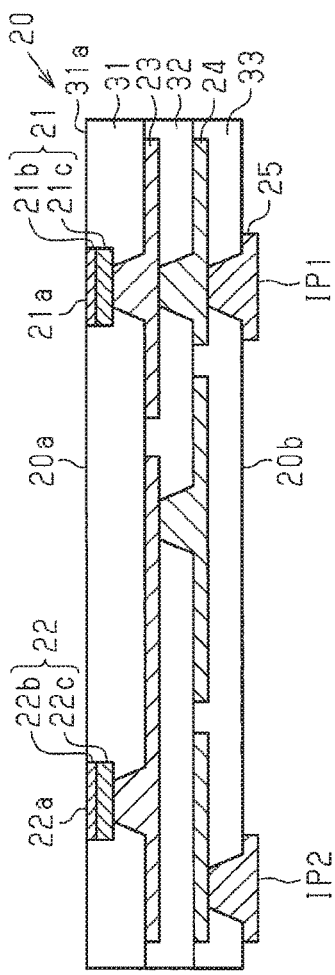
FIG. 9B is a schematic cross-sectional view illustrating a wiring component arranged on the wiring substrate of FIG. 9A.

As illustrated in FIG. 9B, the wiring component 20 includes the external terminals 21, 22 (pads), the wiring layers 23, 24, 25, and the insulation layers 31, 32, 33. In the same manner as the first embodiment, the external terminal 21 includes a plurality (two in present example) of the metal layers 21b, 21c. The external terminal 22 includes a plurality of (two in present example) of the metal layers 22b, 22c. The metal layers 21b, 22b, which are exposed on the upper surface 31a of the insulation layer 31, are each, for example, a gold (Au) layer. The metal layers 21c, 22c, which are embedded in the insulation layer 31, are each, for example, a nickel (Ni) layer.

The wiring layer 23 is formed on the lower surface of the insulation layer 31. The wiring layer 23 includes via wirings, which extend through the insulation layer 31 in the thickness-wise direction to be connected to the external terminals 21, 22, and wiring patterns, which are electrically connected to the external terminals 21, 22 by the via wirings and formed on the lower surface of the insulation layer 31.

The insulation layer 32 is formed on the lower surface of the insulation layer 31 to cover the wiring layer 23. The wiring layer 24 is formed on the lower surface of the insulation layer 32. The wiring layer 24 includes via wirings, which extend through the insulation layer 32 in the thickness-wise direction, and wiring patterns, which are electrically connected to the wiring layer 23 by the via wirings and formed on the lower surface of the insulation layer 32.

The insulation layer 33 is formed on the lower surface of the insulation layer 32 to cover the wiring layer 24. The wiring layer 25 is formed on the lower surface of the insulation layer 33. The wiring layer 25 includes via wirings, which extend through the insulation layer 33 in the thickness-wise direction, and wiring patterns, which are electrically connected to the wiring layer 24 by the via wirings and formed on the lower surface of the insulation layer 33. The wiring patterns of the wiring layer 25, which are formed on the lower surface of the insulation layer 33, serve as the internal connection terminals IP1, IP2.

The material of the wiring layers 23, 24, 25 may be, for example, copper or a copper alloy. The material of the insulation layers 31, 32, 33 may be, for example, a photosensitive resin (e.g., polyimide resin, silicone resin, phenol resin).

As illustrated in FIG. 9A, the insulation layer 101 includes an upper surface 101a including an opening 101X located in a portion that surrounds side surfaces of the wiring component 20. The opening 101X is tapered so as to become smaller at positions further from the upper surface 101a of the insulation layer 101. The adhesive 55 is located in the opening 101X. The adhesive 55 illustrated in FIG. 9A is a remaining portion of an adhesive (adhesive 55 illustrated in FIG. 11C) that is used to adhere the wiring component 20 (structural body 220) to a metal foil 234 in a manufacturing process described below.

As illustrated in FIG. 9A, the external terminals 41, 42 are each, for example, rod-shaped. The upper surfaces 41a, 42a of the external terminals 41, 42 are located coplanar with the surfaces 21a, 22a of the external terminals 21, 22 of the wiring component 20. The lower surfaces 41b, 42b of the external terminals 41, 42 are located substantially coplanar with the lower surface of the internal connection terminals IP1, IP2 of the wiring component 20.

Each of the external terminals 41 includes the metal post 41d and the surface-processed layer 41c, which is formed on the upper surface of the metal post 41d. In the same manner, the external terminal 42 includes the metal post 42d and the surface-processed layer 42c, which is formed on the upper surface of the metal post 42d. The material of the metal posts 41d, 42d may be, for example, copper or a copper alloy. The surface-processed layers 41c, 42c may each be, for example, an Ni/Au layer (metal layer in which Ni layer serves as bottom layer and Au layer is formed on Ni layer).

The wiring layer 43 is formed on the lower surface of the insulation layer 101. The wiring layer 43 includes via wirings, which extend through the insulation layer 101 in the thickness-wise direction to be connected to the external terminals 41, 42 and the internal connection terminals IP1, IP2 of the wiring component 20, and wiring patterns, which are electrically connected to the external terminals 41, 42 and the internal connection terminals IP1, IP2 by the via wirings and formed on the lower surface of the insulation layer 101. The insulation layer 52 is formed on the lower surface of the insulation layer 101 to cover the wiring layer 43. The wiring layer 44 includes via wirings, which extend through the insulation layer 52 in the thickness-wise direction to be connected to the wiring layer 43, and wiring patterns, which are electrically connected to the wiring layer 43 by the via wirings and formed on the lower surface of the insulation layer 52.

The solder resist layer 53 is formed on the lower surface of the insulation layer 52 to partially cover the wiring layer 44. The solder resist layer 53 includes the openings 53X, which partially expose the lower surface of the wiring layer 44 as the external connection terminals EP1. Bumps (not illustrated) are formed on the external connection terminals EP1 to mount the wiring substrate 10a (semiconductor device 1a illustrated in FIG. 10) on a board or the like. The bumps may be, for example, solder bumps.

The material of the wiring layers 43, 44 may be, for example, copper or a copper alloy. The material of the insulation layers 101, 52 may be an insulative resin such as an epoxy resin or a polyimide resin or a resin material in which a filler such as silica or alumina is mixed with an insulative resin such as that described above. The solder resist layer 53 may be, for example, a photosensitive dry film resist or a liquid photoresist. Such a resist material may be, for example, a novolac resin or an acrylic resin.

A method for manufacturing the wiring substrate 10a will now be described. The method for manufacturing the wiring component 20 is the same as that of the first embodiment and thus will not be described or illustrated in the drawings in detail.

In the step of FIG. 11A, the support substrate 230 (first support substrate) is prepared. The support substrate 230 includes the support body 231 and the carrier-incorporating metal foil 232, which is formed on the upper surface of the support body 231. The support body 231 may be, for example, a core obtained by impregnating a reinforcement material such as a woven or non-woven cloth of glass fibers, aramid fibers, or liquid crystal polymer (LCP) fibers with a thermosetting resin such as an epoxy resin or a polyimide resin. The carrier-incorporating metal foil 232 includes a carrier layer 233 and a metal foil 234, which is formed on an upper surface of the carrier layer 233 with a delamination layer (not illustrated) located in between. The carrier layer 233 adheres to the upper surface of the support body 231 with an adhesive layer (not illustrated). The carrier layer 233 is, for example, a copper plate having a thickness of approximately 35 μm. The metal foil 234 is, for example, a copper foil having a thickness of approximately 5 μm.

In the step of FIG. 11B, auxiliary layers 241, 242 are formed on the upper surface 234a of the metal foil 234. The external terminals 41, 42 are formed on the auxiliary layers 241, 242. The material of the auxiliary layers 241, 242 may be, for example, copper (Cu), which is the same material as that of the metal foil 234.

In the present example, a resist layer that includes openings where the external terminals 41, 42 will be formed is formed on the upper surface 234a of the metal foil 234. The resist layer may be, for example, a plating resistant photosensitive dry film resist (e.g., novolac resin or acrylic resin). In this case, the upper surface 234a of the metal foil 234 is laminated with a dry film, and the dry film is patterned through photolithography. This forms the above resist layer including the openings. Alternatively, a liquid photoresist (e.g., novolac resin or acrylic resin) may be used to form the resist layer.

Electrolytic plating (electrolytic copper plating) is performed using the resist layer as a plating mask and the metal foil 234 as a plating power feeding layer to form the auxiliary layers 241, 242 on the upper surface 234a of the metal foil 234 exposed in each opening of the resist layer. The thickness of each of the auxiliary layers 241, 242 is set in accordance with the thicknesses of the metal foil 205 and the adhesive layer of the structural body 220 and may be, for example, 15 μm.

The surface-processed layers 41c, 42c and the metal posts 41d, 42d are sequentially formed on the auxiliary layers 241, 242. For example, when the surface-processed layers 41c, 42c are each an Au/Ni layer, an Au layer having a thickness of 0.1 to 0.2 μm and an Ni layer having a thickness of 2 to 5 μm are sequentially formed on the upper surfaces of the auxiliary layers 241, 242. This forms the surface-processed layers 41c, 42c. Then, a Cu layer is formed on the surface-processed layers 41c, 42c to form the metal posts 41d, 42d. Subsequently, the resist layer is removed, for example, by an alkaline stripping solution.

In the step of FIG. 11C, the adhesive 55 (e.g., adhesive film) and the structural body 220 are arranged on the upper surface 234a of the metal foil 234. The adhesive 55 is cured to fix the structural body 220 to the metal foil 234. In this state, the surfaces 21a, 22a of the external terminals 21, 22 of the wiring component 20 of the structural body 220 are located coplanar with the surfaces 41a, 42a of the external terminals 41, 42. The surfaces 41b, 42b of the external terminals 41, 42 are located substantially coplanar with the upper surfaces of the internal connection terminals IP1, IP2 of the wiring component 20 of the structural body 220.

Figure 12:
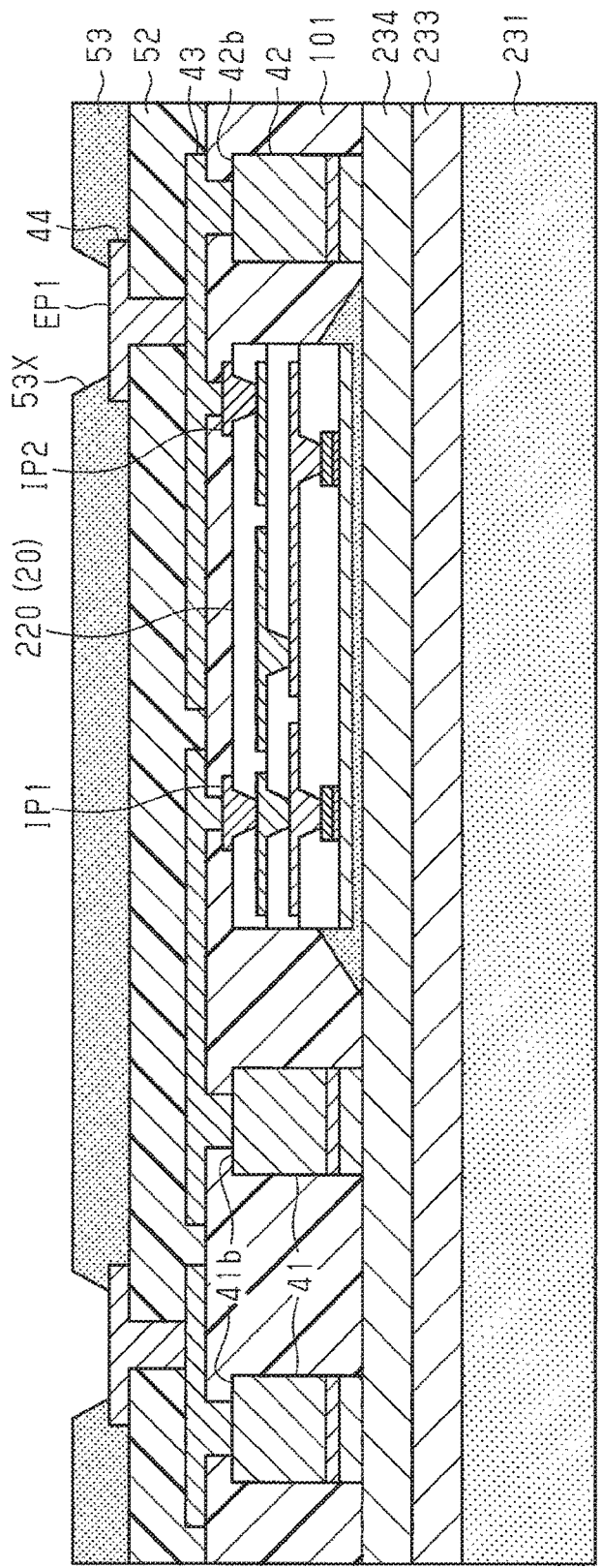

In the step of FIG. 12, the insulation layer 101, the wiring layer 43, the insulation layer 52, the wiring layer 44, and the solder resist layer 53 are formed.

The insulation layer 101 is first formed to cover the external terminals 41, 42 and the structural body 220 (wiring component 20). Then, via holes extending through the insulation layer 101 are formed to partially expose the surfaces 41b, 42b of the external terminals 41, 42 and upper surfaces of the internal connection terminals IP1, IP2. The via holes are formed through laser drilling using, for example, a $CO_2$ laser or a YAG laser. When laser drilling is performed to form the via holes, a desmear process is performed as necessary. The surfaces 41b, 42b of the external terminals 41, 42 are located substantially coplanar with the upper surfaces of the internal connection terminals IP1, IP2 of the wiring component 20 of the structural body 220. Thus, when the via holes are formed through laser drilling, the surfaces 41b, 42b of the external terminals 41, 42 and the upper surfaces of the internal connection terminals IP1, IP2 are exposed in substantially the same process time.

The wiring layer 43 is formed on the upper surface of the insulation layer 101, for example, through a semi-additive process. In the present example, a seed layer is first formed on the upper surface of the insulation layer 101 and wall surfaces of the via holes through electroless plating or sputtering. The seed layer is formed from, for example, copper. Then, a resist layer that includes openings in given locations is formed. Electrolytic plating (electrolytic copper plating) is performed using the seed layer as a plating power feeding layer to form a metal plating layer (copper plating layer) in the openings of the resist layer. After the resist layer is removed, unnecessary portions of the seed layer are removed through etching. This forms the wiring layer 43.

The insulation layer 52 is formed in the same manner as the insulation layer 101 described above. Additionally, the wiring layer 44 is formed in the same manner as the wiring layer 43 described above.

The solder resist layer 53 including the openings 53X is formed on the upper surface of the insulation layer 52. The solder resist layer 53 is obtained, for example, by laminating with a photosensitive solder resist film or applying a liquid solder resist and then performing photolithography on the resist so that the resist is patterned in the desired shape through exposure and development. The openings 53X of the solder resist layer 53 expose portions of the wiring layer 44 as the external connection terminals EP1.

In the step of FIG. 13A, the carrier layer 233, illustrated in FIG. 12, is delaminated from the metal foil 234 to remove the support body 231 and the carrier layer 233 from the metal foil 234.

In the step of FIG. 13B, the metal foil 234 and the auxiliary layers 241, 242, which are illustrated in FIG. 13A, are removed, for example, through etching. In the etching performed on the metal foil 234 and the auxiliary layers 241, 242, the surface-processed layers 41c, 42c of the external terminals 41, 42 function as etching stoppers.

In the step of FIG. 14A, the adhesive 55, which covers the lower surface of the metal foil 205, is removed to expose the lower surface of the metal foil 205. For example, sandblasting, laser abrasion, or mechanical polishing may be used as the process for removing the adhesive 55. In this step, the portions other than the adhesive 55 are covered by a resist layer and protected from the removal process. The resist layer is removed after this process.

In the step of FIG. 14B, the metal foil 205, illustrated in FIG. 14A, is removed, for example, through etching. This exposes surfaces (lower surfaces in FIG. 14B) of the metal layers 21b, 22b (Au layers) of the external terminals 21, 22. Additionally, surfaces (lower surfaces in FIG. 14B) of the surface-processed layers 41c, 42c (Au/Ni layers) of the external terminals 41, 42 are exposed. The metal layers 21b, 22b and the surface-processed layers 41c, 42c, which function as the etching stoppers, allow the metal foil 205 to be selectively etched and removed. The removal of the metal foil 205 obtains the wiring substrate 10a.

The second embodiment has the advantages described below in addition to the advantages of the first embodiment. The following advantage (2-1) of the second embodiment is the same as the foregoing advantage (1-1) of the first embodiment except that the auxiliary layers 241, 242 are used in the second embodiment.

(2-1) The structural body 220 including the wiring component 20 is adhered to the upper surface 234a of the metal foil 234 of the carrier-incorporating metal foil 232 by the adhesive 55 so that the metal foil 205, which covers the external terminals 21, 22 of the wiring component 20, adheres to the adhesive 55. Additionally, the auxiliary layers 241, 242 are formed on the upper surface 234a of the metal foil 234. The external terminals 41, 42 are formed on the auxiliary layers 241, 242. Thus, the auxiliary layers 241, 242 allow the surfaces 41a, 42a of the external terminals 41, 42 to be coplanar with the upper surfaces 21a, 22a of the external terminals 21, 22 of the wiring component 20.

(2-2) Prior to the formation of the external terminals 41, 42, the auxiliary layers 241, 242 are formed, for example, through electrolytic plating using the resist layer to form the external terminals 41, 42. This eliminates the need of the etching step that forms the mount recess 234b as described in the first embodiment. Thus, the time required to move the support substrate 230 between the steps is decreased. This shortens the time required to manufacture the wiring substrate 10a.

It should be apparent to those skilled in the art that the foregoing embodiments may be employed in many other specific forms without departing from the scope of the invention. Particularly, it should be understood that the foregoing embodiments may be employed in the following forms.

In each of the embodiments, as illustrated in FIG. 3A, the wiring component 20 (refer to FIG. 4D) is manufactured using the support substrate 200 in which the carrier-incorporating metal foil 203 adheres to the upper surface of the support body 201. Instead, a plurality of wiring components 20 may be manufactured, for example, using a support substrate in which the carrier-incorporating metal foil 203 adheres to the upper and lower surfaces of the support body 201 illustrated in FIG. 3A.

In the first embodiment, as illustrated in FIG. 5A, the wiring substrate 10 (refer to FIG. 8B) is manufactured using the support substrate 230 in which the carrier-incorporating metal foil 232 adheres to the upper surface of the support body 231. Instead, a plurality of wiring substrates 10 may be manufactured, for example, using a support substrate in which the carrier-incorporating metal foil 232 adheres to the upper and lower surfaces of the support body 231 illustrated in FIG. 5A. In the same manner as this modified example, in the second embodiment, the wiring substrates 10a may be formed on the upper and lower surfaces of the support body 231.

Figure 15:
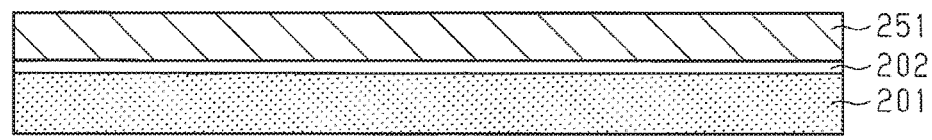
FIG. 15 is a cross-sectional view of a further support substrate.

In each of the embodiments, the carrier-incorporating metal foil 203 is adhered to the upper surface of the support body 201 by the adhesive layer 202, and the wiring component 20 is formed on the upper surface of the carrier-incorporating metal foil 203. Instead, as illustrated in FIG. 15, a metal foil 251 (copper foil) may be adhered to the upper surface of the support body 201 by the adhesive layer 202. In this case, after the wiring component 20 is formed on the upper surface of the metal foil 251, a structural body that includes the metal foil 251 and the wiring component 20 (refer to FIG. 1B) may be delaminated from the support body 201.

Clauses

This disclosure further encompasses the following embodiments.

1. A method for manufacturing a wiring substrate for mounting a first semiconductor element and a second semiconductor element thereon, wherein the first semiconductor element includes a first electrode terminal and a second electrode terminal, and the second semiconductor element includes a third electrode terminal and a fourth electrode terminal, the method including:

forming a structural body that includes a wiring component and a metal foil that covers a first surface of the wiring component, wherein the forming a structural body includes forming a first connection terminal and a second connection terminal that are exposed on the first surface of the wiring component, wherein the first connection terminal is connectable to the first electrode terminal of the first semiconductor element, the second connection terminal is connectable to the third electrode terminal of the second semiconductor element, and the first electrode terminal of the first semiconductor element is electrically connectable to the third electrode terminal of the second semiconductor element by the wiring component, and forming an internal connection terminal on a second surface of the wiring component, wherein the second surface is opposite to the first surface;

forming a mount recess in an upper surface of a first support substrate;

forming an adhesive layer in the mount recess;

embedding the metal foil of the structural body in the mount recess to fix the structural body with the adhesive layer so that an upper surface of the metal foil is located at the same height as the upper surface of the first support substrate;

forming a third connection terminal and a fourth connection terminal on the upper surface of the first support substrate;

forming an insulation layer that covers the structural body, the third connection terminal, and the fourth connection terminal;

forming a wiring layer on an upper surface of the insulation layer, wherein the wiring layer is connected to the internal connection terminal, the third connection terminal, and the fourth connection terminal;

removing the first support substrate;

removing the adhesive layer to expose the metal foil of the structural body; and removing the metal foil of the structural body to expose the first connection terminal and the second connection terminal of the wiring component.

2. A method for manufacturing a wiring substrate for mounting a first semiconductor element and a second semiconductor element thereon, wherein the first semiconductor element includes a first electrode terminal and a second electrode terminal, and the second semiconductor element includes a third electrode terminal and a fourth electrode terminal, the method including:

forming a structural body that includes a wiring component and a metal foil that covers a first surface of the wiring component, wherein the forming a structural body includes forming a first connection terminal and a second connection terminal that are exposed on the first surface of the wiring component, wherein the first connection terminal is connectable to the first electrode terminal of the first semiconductor element, the second connection terminal is connectable to the third electrode terminal of the second semiconductor element, and the first electrode terminal of the first semiconductor element is electrically connectable to the third electrode terminal of the second semiconductor element by the wiring component, and forming an internal connection terminal on a second surface of the wiring component, wherein the second surface is opposite to the first surface;

applying an adhesive layer to an upper surface of a first support substrate;

adhering the metal foil of the structural body to the adhesive layer;

forming an auxiliary layer on the upper surface of the first support substrate so that an upper surface of the auxiliary layer and an upper surface of the metal foil are located at the same height;

forming a third connection terminal and a fourth connection terminal on the auxiliary layer;

forming an insulation layer that covers the structural body, the third connection terminal, and the fourth connection terminal;

forming a wiring layer on an upper surface of the insulation layer, wherein the wiring layer is connected to the internal connection terminal, the third connection terminal, and the fourth connection terminal;

removing the first support substrate and the auxiliary layer;

removing the adhesive layer to expose the metal foil of the structural body; and removing the metal foil of the structural body to expose the first connection terminal and the second connection terminal of the wiring component.

3. The method according to clause 1 or 2, wherein the first support substrate includes a support body, a carrier layer adhered to an upper surface of the support body, and a metal foil formed on an upper surface of the carrier layer with a delamination layer located in between, and the removing the first support substrate includes delaminating the carrier layer from the metal foil of the first support substrate to remove the support body and the carrier layer, and removing the metal foil through etching.

4. The method according to any one of clauses 1 to 3, wherein the forming a structural body includes preparing a second support substrate that includes a carrier plate and a metal foil formed on an upper surface of the carrier plate with a delamination layer located in between, forming the first connection terminal and the second connection terminal on an upper surface of the metal foil of the second support substrate, alternately forming a plurality of insulation layers and a plurality of wiring layers on an upper surface side of the metal foil of the second support substrate, patterning an uppermost one of the wiring layers to form the internal connection terminal, forming a first support layer on an upper surface of an uppermost one of the insulation layers, delaminating the carrier plate from the metal foil of the second support substrate, forming a second support layer on a lower surface of the metal foil of the second support substrate, and removing the first support layer after the second support layer is formed, the method further comprising removing the second support layer from the metal foil of the second support substrate before adhering the structural body to the first support substrate.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. A wiring substrate comprising:
a wiring component adapted to be connected to a first semiconductor element and a second semiconductor element, wherein the first semiconductor element includes a first electrode terminal and a second electrode terminal, and the second semiconductor element includes a third electrode terminal and a fourth electrode terminal, wherein
the wiring component includes
a first connection terminal exposed on an upper surface of the wiring component and adapted to be connected to the first electrode terminal of the first semiconductor element,
a second connection terminal exposed on the upper surface of the wiring component and adapted to be connected to the third electrode terminal of the second semiconductor element, and
an internal connection terminal formed on a lower surface of the wiring component, and
the first connection terminal is electrically connected to the second connection terminal within the wiring component;
a third connection terminal adapted to be connected to the second electrode terminal of the first semiconductor element;
a fourth connection terminal adapted to be connected to the fourth electrode terminal of the second semiconductor element;
an insulation layer that embeds the wiring component, the third connection terminal, and the fourth connection terminal, wherein the insulation layer covers lower and side surfaces of the wiring component, lower and side surfaces of the third connection terminal, and lower and side surfaces of the fourth connection terminal and exposes an upper surface of the wiring component, an upper surface of the third connection terminal, and an upper surface of the fourth connection terminal; and
a wiring layer formed on a lower surface of the insulation layer and connected to the internal connection terminal, wherein
an upper surface of the first connection terminal, an upper surface of the second connection terminal, the upper surface of the third connection terminal, and the upper surface of the fourth connection terminal are located coplanar with one another.

2. The wiring substrate according to claim 1, wherein
the third connection terminal and the fourth connection terminal are rod-shaped and extended in a thickness-wise direction of the insulation layer, and
a length of each of the third connection terminal and the fourth connection terminal in the thickness-wise direction of the insulation layer corresponds to a thickness of the wiring component.

3. The wiring substrate according to claim 1, wherein
the upper surfaces of the first to fourth connection terminals are located coplanar with the upper surface of the wiring component and an upper surface of the insulation layer.

4. The wiring substrate according to claim 1, wherein
the upper surfaces of the first to fourth connection terminals are located coplanar with the upper surface of the wiring component and located at a position lower than an upper surface of the insulation layer.

5. A semiconductor device comprising:
a wiring substrate;
a first semiconductor element that includes a first electrode terminal and a second electrode terminal; and
a second semiconductor element that includes a third electrode terminal and a fourth electrode terminal, wherein
the wiring substrate includes:
a wiring component connected to the first semiconductor element and the second semiconductor element, wherein the wiring component includes
a first connection terminal exposed on an upper surface of the wiring component and connected to the first electrode terminal of the first semiconductor element,
a second connection terminal exposed on the upper surface of the wiring component and connected to the third electrode terminal of the second semiconductor element, and
an internal connection terminal formed on a lower surface of the wiring component, and
the wiring component electrically connects the first electrode terminal of the first semiconductor element and the third electrode terminal of the second semiconductor element;
a third connection terminal connected to the second electrode terminal of the first semiconductor element;
a fourth connection terminal connected to the fourth electrode terminal of the second semiconductor element;
an insulation layer that embeds the wiring component, the third connection terminal, and the fourth connection terminal, wherein the insulation layer covers lower and side surfaces of the wiring component, lower and side surfaces of the third connection terminal, and lower and side surfaces of the fourth connection terminal and exposes an upper surface of the wiring component, an upper surface of the third connection terminal, and an upper surface of the fourth connection terminal; and
a wiring layer formed on a lower surface of the insulation layer and connected to the internal connection terminal, wherein
an upper surface of the first connection terminal, an upper surface of the second connection terminal, the upper surface of the third connection terminal, and the upper surface of the fourth connection terminal are located coplanar with one another.

* * * * *